US012616061B2

(12) United States Patent
Nochida

(10) Patent No.: US 12,616,061 B2
(45) Date of Patent: Apr. 28, 2026

(54) SEMICONDUCTOR MODULE

(71) Applicant: ROHM CO., LTD., Kyoto (JP)

(72) Inventor: Atsushi Nochida, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 818 days.

(21) Appl. No.: 17/781,894

(22) PCT Filed: Dec. 4, 2020

(86) PCT No.: PCT/JP2020/045226
§ 371 (c)(1),
(2) Date: Jun. 2, 2022

(87) PCT Pub. No.: WO2021/131611
PCT Pub. Date: Jul. 1, 2021

(65) Prior Publication Data
US 2022/0375903 A1 Nov. 24, 2022

(30) Foreign Application Priority Data

Dec. 25, 2019 (JP) ................................. 2019-235147

(51) Int. Cl.
*H01L 25/07* (2006.01)
*H01L 23/00* (2006.01)
(Continued)

(52) U.S. Cl.
CPC ............. *H01L 25/072* (2013.01); *H10D 8/60* (2025.01); *H10D 12/481* (2025.01); *H01L 24/45* (2013.01);
(Continued)

(58) Field of Classification Search
CPC ...... H10D 8/60; H10D 12/481; H10D 62/142; H10D 84/611; H10D 84/87;
(Continued)

(56) References Cited

U.S. PATENT DOCUMENTS

| | | | | |
|---|---|---|---|---|
| 7,157,785 B2 * | 1/2007 | Takei | ................... | H10D 62/127 |
| | | | | 257/E29.198 |
| 2010/0007026 A1 * | 1/2010 | Shikano | ................. | H01L 25/18 |
| | | | | 257/773 |

(Continued)

FOREIGN PATENT DOCUMENTS

| | | | | | |
|---|---|---|---|---|---|
| JP | H0645511 A | * | 2/1994 | | |
| JP | 2001238460 A | * | 8/2001 | ............ | H02M 7/797 |

(Continued)

OTHER PUBLICATIONS

International Search Report issued for International Patent Application No. PCT/JP2020/045226, Date of mailing: Mar. 9, 2021, 5 pages including English translation.

(Continued)

*Primary Examiner* — William B Partridge
*Assistant Examiner* — Linda J. Fleck
(74) *Attorney, Agent, or Firm* — XSENSUS LLP

(57) ABSTRACT

The semiconductor module includes a first device that has an IGBT and a second device that has a reflux diode which is anti-parallel connected to the IGBT, which has a forward threshold voltage less than a reverse withstand voltage of the IGBT, and which has a forward breakdown voltage in excess of the reverse withstand voltage of the IGBT.

11 Claims, 17 Drawing Sheets

(51) Int. Cl.
　　*H10D 8/60* 　　　　(2025.01)
　　*H10D 12/00* 　　　(2025.01)
(52) U.S. Cl.
　　CPC ............... *H01L 2224/45124* (2013.01); *H01L 2224/45144* (2013.01); *H01L 2224/45147* (2013.01); *H01L 2224/48* (2013.01); *H01L 2224/48245* (2013.01)
(58) Field of Classification Search
　　CPC ... H01L 2924/10272; H01L 2924/1033; H01L 2924/1203; H01L 2924/12032; H01L 2924/13055; H01L 2924/181; H01L 2224/45124; H01L 2224/45144; H01L 2224/45147; H01L 2224/48; H01L 2224/48245; H01L 2224/04026; H01L 2224/04042; H01L 2224/0603; H01L 2224/06181; H01L 2224/29101; H01L 2224/48247; H01L 2224/49111; H01L 2224/49113; H01L 2224/73265; H01L 2224/83801; H01L 24/45; H01L 24/48; H01L 24/49; H01L 24/73; H01L 24/05; H01L 24/06; H01L 24/32; H01L 25/072; H01L 25/18; H02K 15/0646; H02K 15/40
　　See application file for complete search history.

(56) References Cited

U.S. PATENT DOCUMENTS

| | | | | |
|---|---|---|---|---|
| 2012/0224288 | A1* | 9/2012 | Uota | .................. H03K 17/0828 |
| | | | | 361/79 |
| 2012/0256574 | A1 | 10/2012 | Tanaka et al. | |

| | | | | |
|---|---|---|---|---|
| 2013/0294124 | A1* | 11/2013 | Fujita | ..................... H02M 7/04 |
| | | | | 363/84 |
| 2014/0117406 | A1* | 5/2014 | Kakefu | ................... H01L 29/32 |
| | | | | 438/135 |
| 2014/0320178 | A1* | 10/2014 | Hosini | ................... H03K 3/012 |
| | | | | 327/109 |
| 2014/0377938 | A1* | 12/2014 | Nakazawa | ............. C30B 31/22 |
| | | | | 438/476 |
| 2015/0031175 | A1* | 1/2015 | Teranishi | ............... H10D 62/83 |
| | | | | 438/138 |
| 2017/0352648 | A1* | 12/2017 | Yasui | ...................... H01L 25/07 |
| 2018/0287510 | A1* | 10/2018 | Saha | ................. H02M 7/53875 |
| 2019/0386093 | A1* | 12/2019 | Pfirsch | ................ H10D 84/138 |

FOREIGN PATENT DOCUMENTS

| | | | |
|---|---|---|---|
| JP | 2008047565 | | 2/2008 |
| JP | 2008047565 | A * | 2/2008 |
| JP | 2017041989 | | 2/2017 |
| WO | 2011086705 | | 7/2011 |

OTHER PUBLICATIONS

Written Opinion issued for International Patent Application No. PCT/JP2020/045226, Date of mailing: Mar. 9, 2021, 8 pages including English machine translation.

Japanese Notice of Reasons for Refusal issued Jul. 25, 2024 in corresponding Japanese Patent Application No. 2021-567156, 5 pages.

* cited by examiner

1

Emitter
(Anode)

Gate

21

31

Collector
(Cathode)

1

Emitter
(Anode)

IRS

Gate

21

IF

31

VF
(<VRB)

Collector
(Cathode)

1

1

51A

51B

SEMICONDUCTOR MODULE

TECHNICAL FIELD

The present invention relates to a semiconductor module which includes an IGBT (Insulated Gate Bipolar Transistor) and a reflux diode.

BACKGROUND ART

Patent Literature 1 discloses a semiconductor module including an IGBT and a reflux diode which is anti-parallel connected to the IGBT.

CITATION LIST

Patent Literature

Patent Literature 1: WO No. 2011/086705A1

SUMMARY OF INVENTION

Technical Problem

Patent Literature 1 does not disclose a technology up to the extent of enhancing a reverse surge resistance of a semiconductor module. In an IGBT that is in an off state, where a reverse surge current is applied between an emitter and a collector of the IGBT, the reverse surge current bypasses the IGBT and flows into a reflux diode as a forward surge current. A forward voltage of the reflux diode increases with an increase in forward surge current. When the forward voltage exceeds a forward breakdown voltage, the reflux diode breaks down. Therefore, the reverse surge resistance of the semiconductor module is limited by the forward breakdown voltage of the reflux diode.

One embodiment of the present invention provides a semiconductor module which includes an IGBT and a reflux diode and is capable of enhancing a reverse surge resistance.

Solution to Problem

One embodiment of the present invention provides a semiconductor module including a first device that has an IGBT and a second device that has a reflux diode which is anti-parallel connected to the IGBT, which has a forward threshold voltage less than a reverse withstand voltage of the IGBT, and which has a forward breakdown voltage in excess of the reverse withstand voltage of the IGBT.

The aforementioned as well as yet other objects, features and effects of the present invention will be made clear by the following description of the embodiments, with reference to the accompanying drawings.

DESCRIPTION OF EMBODIMENTS

Figure 1:
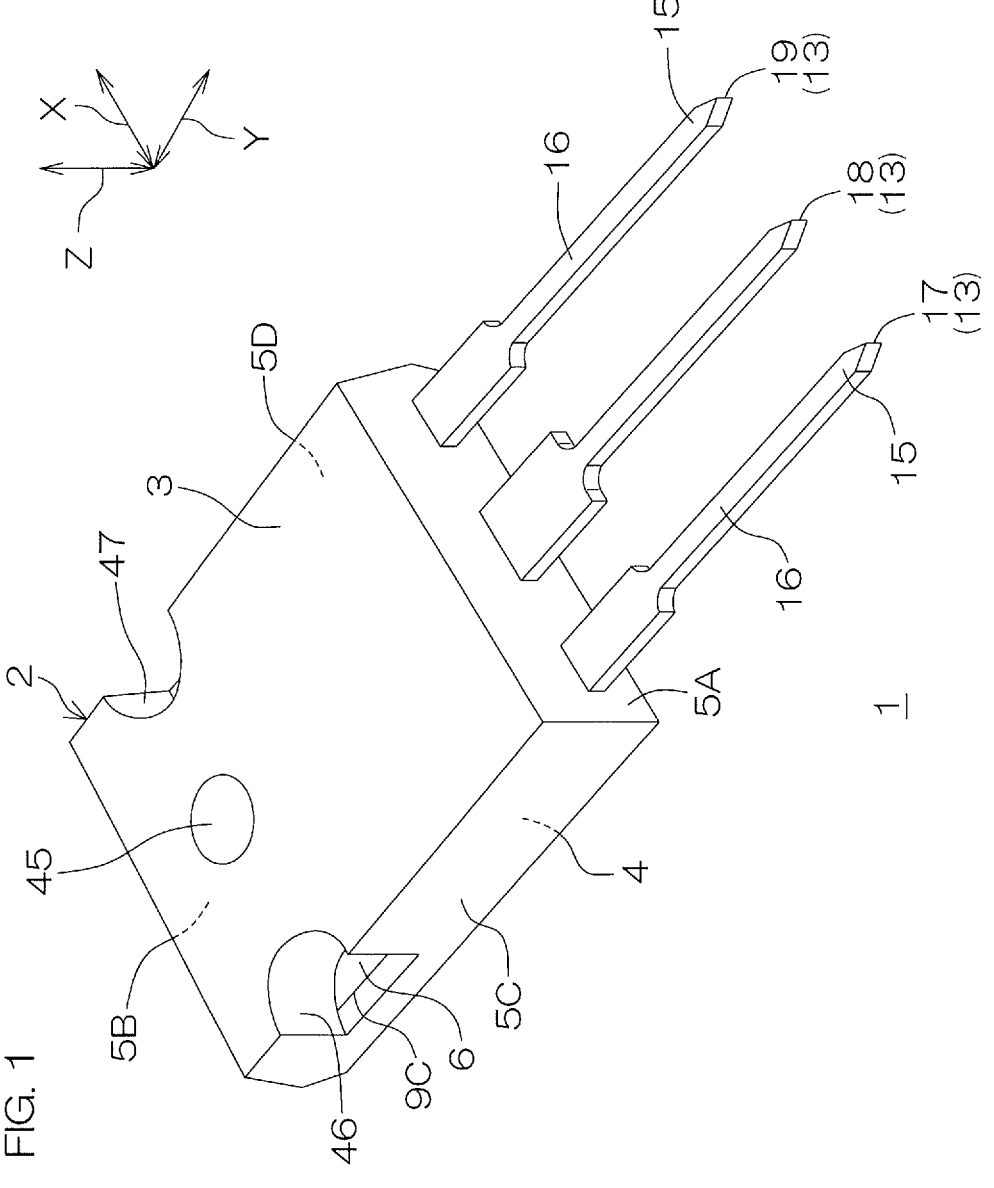
FIG. 1 is a perspective view which shows a semiconductor module according to a first embodiment of the present invention.
Figure 2:
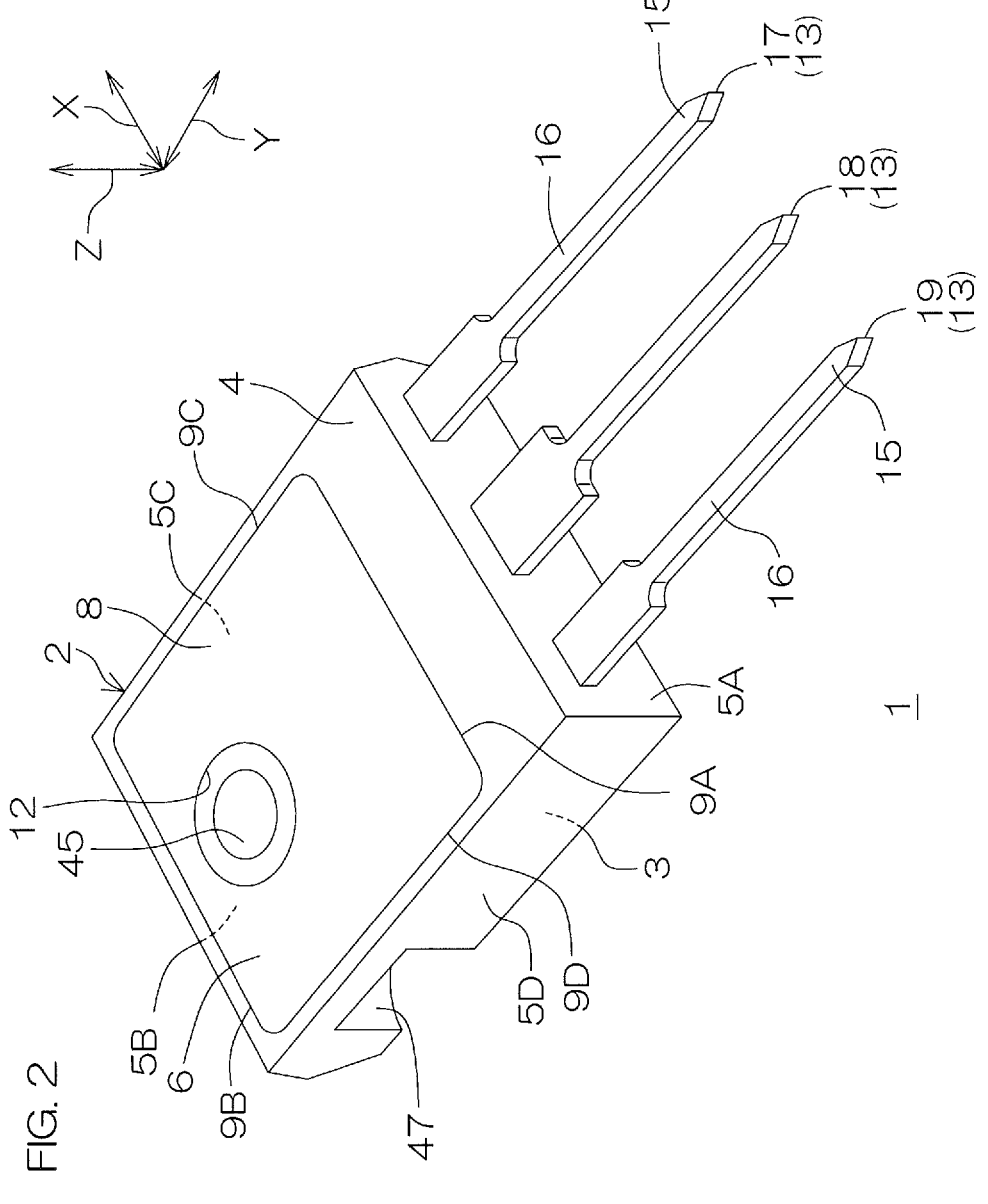
FIG. 2 is a perspective view of the semiconductor module shown in FIG. 1 which is viewed from a different direction.
Figure 3:
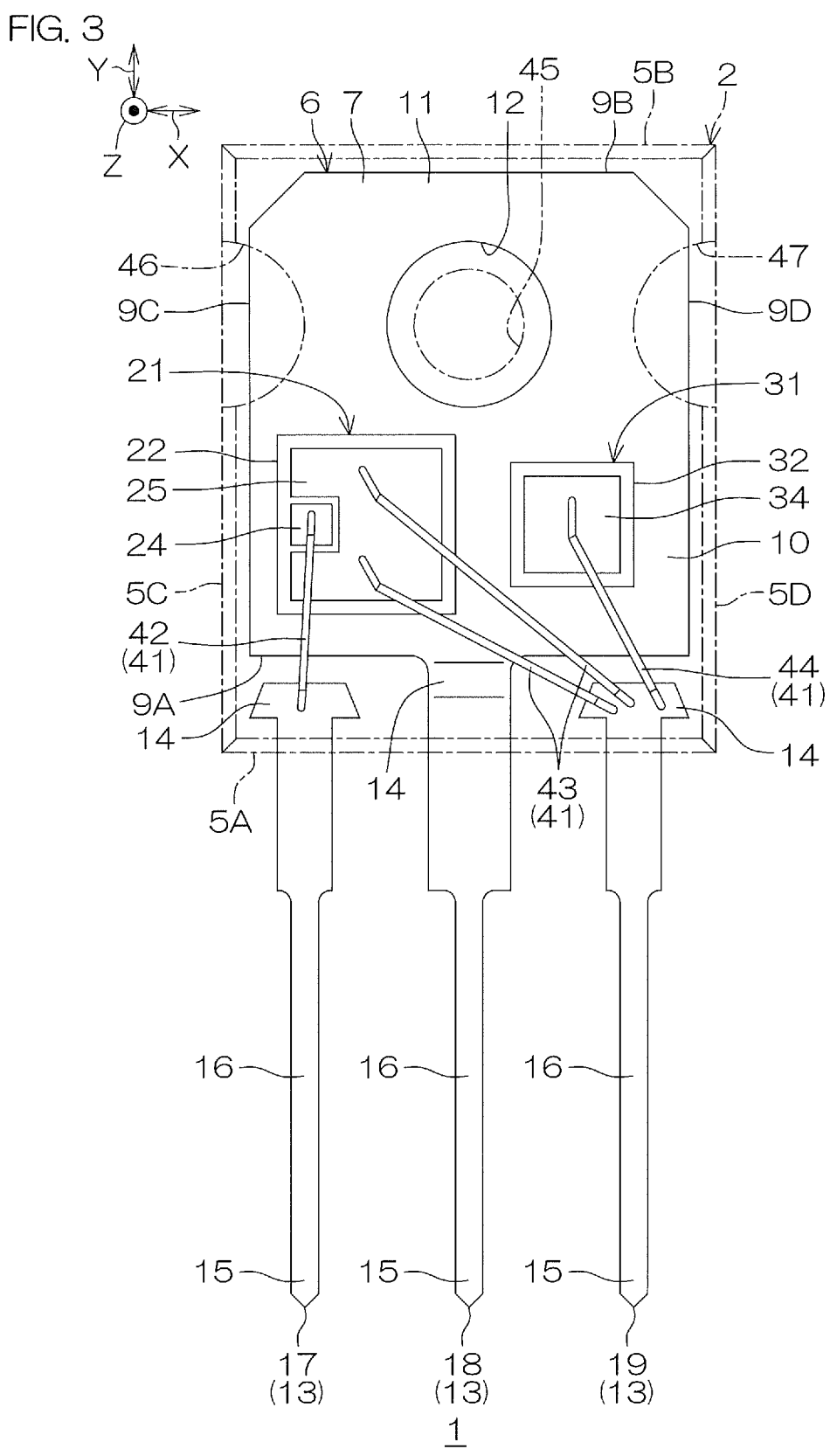
FIG. 3 is a plan view which shows an inner structure of the semiconductor module shown in FIG. 1.
Figure 4A:
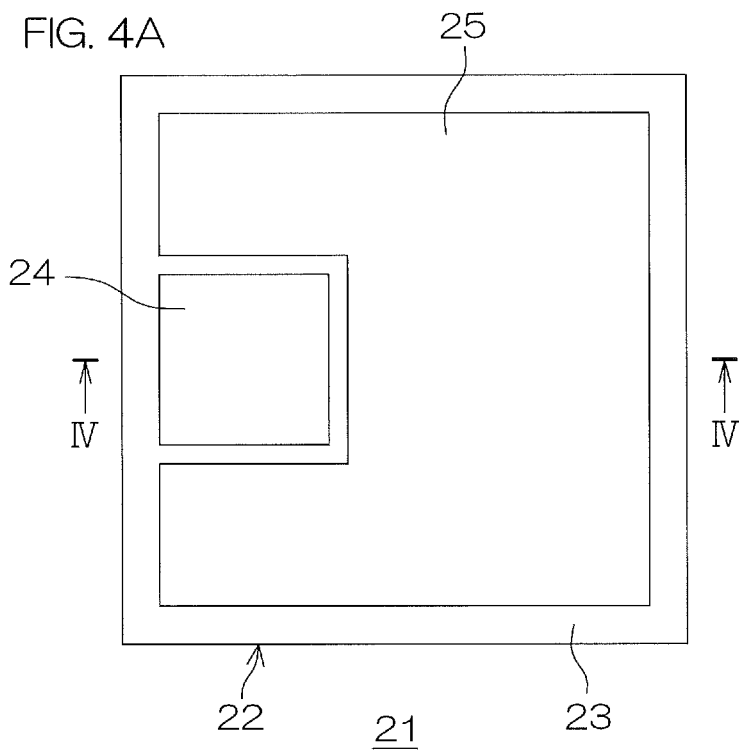
FIG. 4A is a plan view which shows a first device shown in FIG. 3.
Figure 4B:
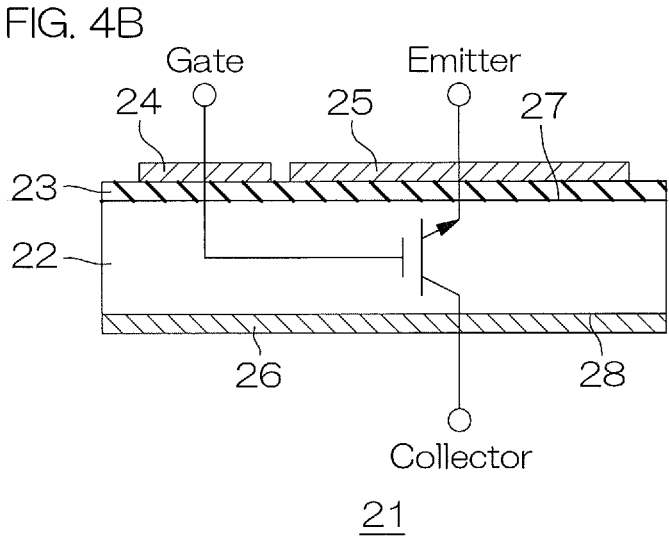
FIG. 4B is a sectional view taken along line IV-IV shown in FIG. 4A.
Figure 5A:
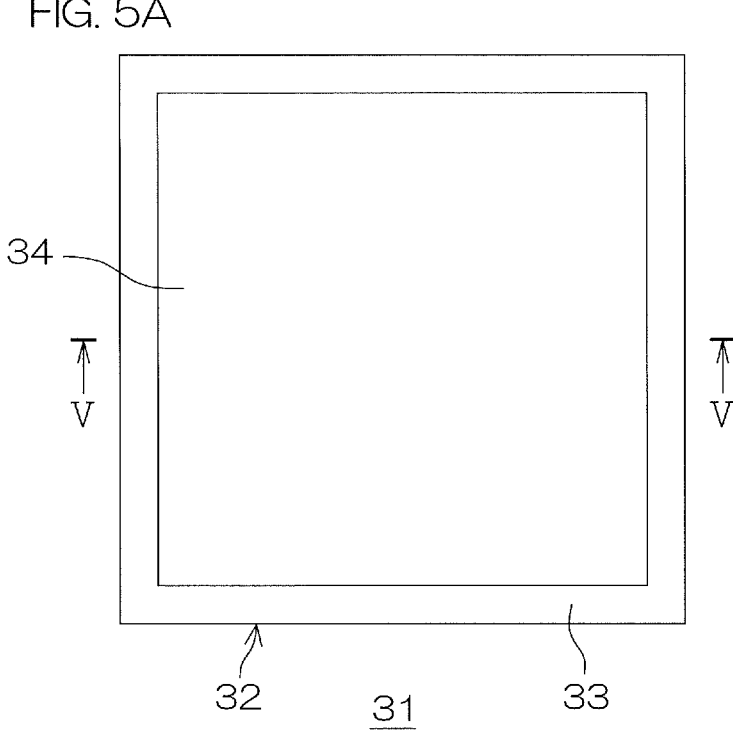
FIG. 5A is a plan view which shows a second device shown in FIG. 3.
Figure 5B:
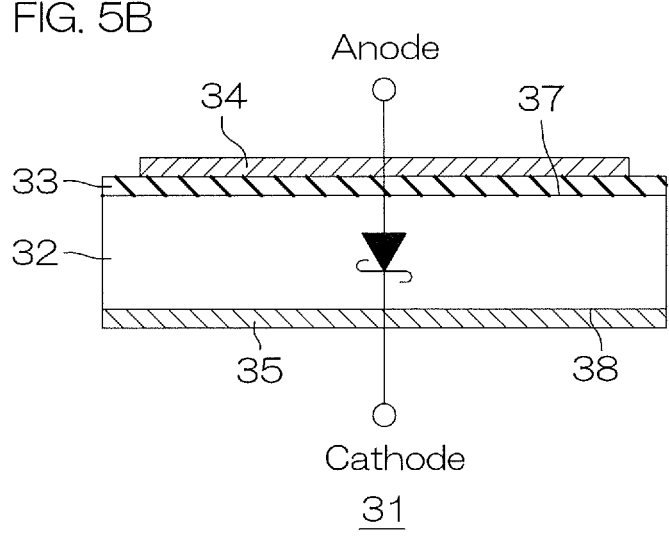
FIG. 5B is a sectional view taken along line V-V shown in FIG. 5A.
Figure 6:
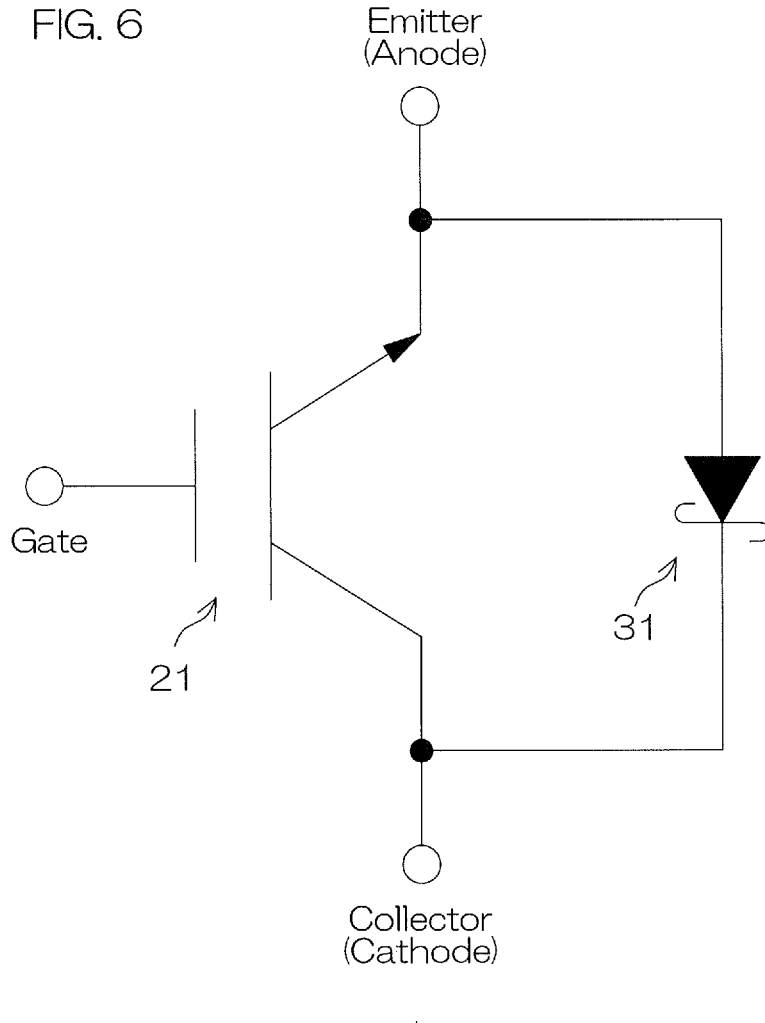
FIG. 6 is a circuit diagram which shows an electrical structure of the semiconductor module shown in FIG. 1.

FIG. 1 is a perspective view which shows a semiconductor module 1 according to a first embodiment of the present invention. FIG. 2 is a perspective view of the semiconductor module 1 shown in FIG. 1 which is viewed from a different direction. FIG. 3 is a plan view which shows an inner structure of the semiconductor module 1 in FIG. 1. FIG. 4A is a plan view which shows a first device 21 in FIG. 3. FIG. 4B is a sectional view taken along line IV-IV shown in FIG. 4A. FIG. 5A is a plan view which shows a second device 31 in FIG. 3. FIG. 5B is a sectional view taken along line V-V shown in FIG. 5A. FIG. 6 is a circuit diagram which shows an electrical structure of the semiconductor module 1 in FIG. 1.

With reference to FIG. 1 to FIG. 6, in this embodiment, the semiconductor module 1 is constituted of one package type module in which an IGBT (Insulated Gate Bipolar Transistor) and a reflux diode are housed in one package. The reflux diode is also referred to as a freewheel diode.

In this embodiment, the semiconductor module 1 is constituted of a TO-type package with three terminals (specifically, a TO-247 package). The semiconductor module 1 includes a package main body 2. The package main body 2 is made of a mold resin (for example, epoxy resin) and formed in a rectangular parallelepiped shape. The package main body 2 has a first main surface 3 at one side, a second main surface 4 at another side and first to fourth side walls 5A to 5D which connect the first main surface 3 and the second main surface 4. The first main surface 3 and the second main surface 4 are formed in a quadrilateral shape (specifically, a rectangular shape) in a plan view as viewed from a normal direction Z thereof.

The first side wall 5A and the second side wall 5B extend along a first direction X along the first main surface 3 and face a second direction Y which is orthogonal to the first direction X. The first side wall 5A and the second side wall 5B constitute short sides of the package main body 2. The third side wall 5C and the fourth side wall 5D extend along the second direction Y and face the first direction X. The third side wall 5C and the fourth side wall 5D constitute long sides of the package main body 2.

The semiconductor module 1 includes a metal plate 6 which is arranged inside the package main body 2. The metal plate 6 includes at least one of copper, a copper based alloy, iron and an iron based alloy. The metal plate 6 has a first plate surface 7 at one side, a second plate surface 8 at another side and first to fourth plate side walls 9A to 9D which connect the first plate surface 7 and the second plate surface 8.

The first plate surface 7 and the second plate surface 8 are formed in a quadrilateral shape (specifically, a rectangular shape) in plan view. The first plate surface 7 is positioned inside the package main body 2 and faces the first main surface 3. The second plate surface 8 is exposed from the second main surface 4 of the package main body 2. Thereby, the metal plate 6 functions as a heat spreader. The first to fourth plate side walls 9A to 9D are positioned inside the package main body 2 and extend in parallel respectively to the first to fourth side walls 5A to 5D.

The metal plate 6 includes a first region 10 on the first side wall 5A side and a second region 11 on the second side wall 5B side. The first region 10 is a pad region. The second region 11 has a first through hole 12 which passes through the second plate surface 8 from the first plate surface 7. The first through hole 12 is formed in a circular shape in plan view. A planar shape of the first through hole 12 is arbitrary and may be formed in a polygonal shape such as a quadrilateral shape.

The semiconductor module 1 includes a plurality (three in this embodiment) of lead terminals 13. The plurality of lead terminals 13 are arranged on the first side wall 5A side of the package main body 2 and led out from an interior of the package main body 2 to an exterior thereof. The plurality of lead terminals 13 are mounting terminals for a circuit substrate of a PCB (printed circuit board), etc.

The plurality of lead terminals 13 each include at least one of copper, a copper based alloy, iron and an iron based alloy. On an outer surface of each of the plurality of lead terminals 13, a plating film made of a metal having a property high in affinity (that is, binding force) for solder may be formed. The plating film may include at least one of an Ni plating film, a Pd plating film and an Au plating film.

The plurality of lead terminals 13 are each formed in a band shape extending in an orthogonal direction to the first side wall 5A (that is, second direction Y). The plurality of lead terminals 13 each have a plate surface parallel to the first main surface 3 (second main surface 4) of the package main body 2. The plurality of lead terminals 13 each include an internal end portion 14, an external end portion 15 and a lead portion 16. The internal end portion 14 is positioned inside the package main body 2. The external end portion 15 is positioned outside the package main body 2. The lead portion 16 is led out from the interior of the package main body 2 to the exterior of the package main body 2 and extends in a band shape between the internal end portion 14 and the external end portion 15.

Specifically, the plurality of lead terminals 13 include a gate lead terminal 17, a collector/cathode lead terminal 18 and an emitter/anode lead terminal 19. The gate lead terminal 17, the collector/cathode lead terminal 18 and the emitter/anode lead terminal 19 are arrayed in that order from the third side wall 5C side toward the fourth side wall 5D side. The gate lead terminal 17 is a terminal to which a gate potential is to be applied. The collector/cathode lead terminal 18 is a terminal to which a collector potential (cathode potential) is to be applied. The emitter/anode lead terminal 19 is a terminal to which an emitter potential (anode potential) is to be applied.

The internal end portion 14 of the gate lead terminal 17 and the internal end portion 14 of the emitter/anode lead terminal 19 are arranged at intervals from the metal plate 6. The internal end portion 14 of the collector/cathode lead terminal 18 is formed integrally with the metal plate 6 and fixes the metal plate 6 at the same potential. Thereby, the metal plate 6 forms a part of the collector/cathode lead terminal 18.

A shape and an arrangement of the plurality of lead terminals 13 are arbitrary and not limited to the embodiments shown in FIG. 1 to FIG. 3. Further, arrangements of the gate lead terminal 17, the collector/cathode lead terminal 18 and the emitter/anode lead terminal 19 are arbitrary and not limited to the arrangements shown in FIG. 1 to FIG. 3. Further, the internal end portion 14 of the collector/cathode lead terminal 18 may be arranged at an interval from the metal plate 6.

With reference to FIG. 3 to FIG. 6, the semiconductor module 1 includes a chip-like first device 21 having the IGBT. The first device 21 is arranged on the metal plate 6 (first plate surface 7 of first region 10) inside the package main body 2. In this embodiment, the first device 21 is arranged in a region on the third plate side wall 9C (third side wall 5C) side in the first plate surface 7.

With reference to FIG. 4A and FIG. 4B, specifically, the first device 21 includes a first semiconductor chip 22, a first interlayer insulating film 23, a gate terminal electrode 24, an emitter terminal electrode 25 and a collector terminal electrode 26. In this embodiment, the first semiconductor chip 22 is constituted of Si (silicon). That is, the IGBT is constituted of a Si-IGBT.

The first semiconductor chip 22 includes a first device surface 27 and a first non-device surface 28. The first device surface 27 is a surface in which a major portion of the IGBT is formed. The first non-device surface 28 is a surface at the opposite side of the first device surface 27. The IGBT may be a trench gate type which includes a trench gate structure formed in the first device surface 27. The IGBT may be a planar gate type which includes a planar gate structure formed on the first device surface 27.

The first interlayer insulating film 23 covers the first device surface 27. The first interlayer insulating film 23 may include at least one of silicon oxide and silicon nitride. The gate terminal electrode 24 is formed on the first interlayer insulating film 23. The gate terminal electrode 24 passes through the first interlayer insulating film 23 and is electrically connected to a gate of the IGBT.

The emitter terminal electrode 25 is formed on the first interlayer insulating film 23 at an interval from the gate terminal electrode 24. The emitter terminal electrode 25 passes through the first interlayer insulating film 23 and is electrically connected to an emitter of the IGBT. The collector terminal electrode 26 covers the first non-device surface 28 and is electrically connected to a collector of the IGBT. That is, the first device 21 has the vertically-structured IGBT.

The first device 21 is arranged on the metal plate 6 in such a posture that the gate terminal electrode 24 and the emitter terminal electrode 25 are opposed to the first main surface 3. The collector terminal electrode 26 of the first device 21 is mechanically and electrically connected to the metal plate 6 via a conductive bonding material (for example, solder).

With reference to FIG. 3 to FIG. 6, the semiconductor module 1 includes a chip-like second device 31 which has the reflux diode. In this embodiment, the reflux diode is constituted of an SBD (Schottky Barrier Diode). The second device 31 is arranged on the metal plate 6 (first plate surface 7 of first region 10) at an interval from the first device 21 inside the package main body 2. In this embodiment, the second device 31 is arranged at a region on the fourth plate side wall 9D (fourth side wall 5D) side in the first plate surface 7. The second device 31 opposes the first device 21 in the first direction X.

With reference to FIG. 5A and FIG. 5B, specifically, the second device 31 includes a second semiconductor chip 32, a second interlayer insulating film 33, an anode terminal electrode 34 and a cathode terminal electrode 35. The second semiconductor chip 32 is constituted of Si or a wide band gap semiconductor having a band gap in excess of a band gap of Si. That is, the second semiconductor chip 32 may be constituted of the same semiconductor as the first semiconductor chip 22 or may be constituted of a semiconductor different from the first semiconductor chip 22.

The second semiconductor chip 32 is preferably constituted of a wide band gap semiconductor. The second semiconductor chip 32 may be constituted of SiC (silicon carbide) or GaN (gallium nitride) as an example of the wide band gap semiconductor. In this embodiment, the second semiconductor chip 32 is constituted of SiC. That is, the reflux diode is constituted of SiC-SBD.

The second semiconductor chip 32 includes a second device surface 37 and a second non-device surface 38. The second device surface 37 is a surface in which a major portion of SBD is formed. The second non-device surface 38 is a surface at the opposite side of the second device surface 37. The second semiconductor chip 32 may have a planar area less than a planar area of the first semiconductor chip 22 in plan view.

The second interlayer insulating film 33 covers the second device surface 37. The second interlayer insulating film 33 may include at least one of silicon oxide and silicon nitride. The anode terminal electrode 34 is formed on the second interlayer insulating film 33. The anode terminal electrode 34 has a planar area in excess of a planar area of the gate terminal electrode 24. The planar area of the anode terminal electrode 34 is less than a planar area of the emitter terminal electrode 25.

The anode terminal electrode 34 passes through the second interlayer insulating film 33 and is electrically connected to an anode of the reflux diode. The cathode terminal electrode 35 covers the second non-device surface 38 of the second semiconductor chip 32 and is electrically connected to a cathode of the reflux diode. That is, the second semiconductor chip 32 has the vertically-structured reflux diode.

The second device 31 is arranged on the metal plate 6 in such a posture that the anode terminal electrode 34 is opposed to the first main surface 3. The cathode terminal electrode 35 of the second device 31 is mechanically and electrically connected to the metal plate 6 via a conductive bonding material (for example, solder). Thereby, the cathode of the reflux diode is electrically connected to the collector of the IGBT via the metal plate 6.

The semiconductor module 1 includes a plurality (four in this embodiment) of lead wires 41, each of which electrically connects the first device 21 and the second device 31 to a corresponding lead terminal 13 inside the package main body 2. The plurality of lead wires 41 are each constituted of a bonding wire. The plurality of lead wires 41 may include at least one of a copper wire, a gold wire and an aluminum wire. In this embodiment, the plurality of lead wires 41 are each constituted of an aluminum wire.

Specifically, the plurality of lead wires 41 include one or a plurality (one in this embodiment) of gate lead wires 42, one or a plurality (two in this embodiment) of emitter lead wires 43 and one or a plurality (one in this embodiment) of anode lead wires 44. The number of the gate lead wires 42, the emitter lead wires 43 and the anode lead wires 44 is arbitrary and adjusted according to a planar area and a planar shape of each of the gate terminal electrode 24, the emitter terminal electrode 25 and the anode terminal electrode 34.

The gate lead wire 42 is connected to the internal end portion 14 of the gate lead terminal 17 and the gate terminal electrode 24 of the first device 21. The emitter lead wires 43 are connected to the internal end portion 14 of the emitter/anode lead terminal 19 and the emitter terminal electrode 25 of the first device 21. The anode lead wire 44 is connected to the internal end portion of the emitter/anode lead terminal 19 and the anode terminal electrode 34 of the second device 31.

Thereby, the anode of the reflux diode is electrically connected to the emitter of the IGBT via the emitter lead wire 43, the anode lead wire 44 and the emitter/anode lead terminal 19. Where the internal end portion 14 of the collector/cathode lead terminal 18 is arranged at an interval from the metal plate 6, the plurality of lead wires 41 include a collector/cathode lead wire. In this case, the collector/cathode lead wire is connected to the metal plate 6, and the internal end portion 14 of the collector/cathode lead terminal 18.

The semiconductor module 1 includes a second through hole 45 which passes through the package main body 2 from the first main surface 3 to the second main surface 4. The second through hole 45 is formed inside a region surrounded by the first through hole 12 of the metal plate 6 and passes through the first through hole 12. The second through hole 45 has an area less than an area of the first through hole 12 in plan view.

An inner wall of the second through hole 45 is demarcated by a mold resin and opposes an inner wall of the first through hole 12 across a part of the package main body (mold resin). The second through hole 45 is formed in a circular shape in plan view. A planar shape of the second through hole 45 is arbitrary and may be formed in a polygonal shape such as a quadrilateral shape. The semiconductor module 1 is screwed to an external heat sink or others by inserting a screw into the second through hole 45.

The semiconductor module 1 includes a first notched portion 46 and a second notched portion 47 which are formed in the package main body 2. The first notched portion 46 is formed at a position which opposes the second through hole 45 in the first direction X in the third side wall 5C. The first notched portion 46 is formed by notching a part of the first main surface 3 from the third side wall 5C toward the fourth side wall 5D and exposes a part of the metal plate 6 (third plate side wall 9C). The first notched portion 46 is formed in a semi-circular shape which is recessed toward the fourth side wall 5D in plan view. A planar shape of the first notched portion 46 is arbitrary and may be formed in a quadrilateral shape (for example, tetragonal shape).

The second notched portion 47 is formed at a position which opposes the second through hole 45 in the first direction X in the fourth side wall 5D. The second notched portion 47 is formed by notching a part of the first main surface 3 from the fourth side wall 5D toward the third side wall 5C and exposes a part of the metal plate 6 (fourth plate side wall 9D). The second notched portion 47 is formed in a semi-circular shape which is recessed toward the third side wall 5C in plan view. A planar shape of the second notched portion 47 is arbitrary and may be formed in a quadrilateral shape (for example, tetragonal shape).

The semiconductor module 1 is not limited to the TO-type package but may be constituted of SOP (Small Outline Package), QFN (Quad For Non Lead Package), DFP (Dual Flat Package), DIP (Dual Inline Package), QFP (Quad Flat Package), SIP (Single Inline Package), SOJ (Small Outline J-leaded Package) or other similar packages. These packages are different in shape of the package main body 2 as well as in arrangement and shape of the lead terminal 13 from the TO-type package but similar in basic structure (including the electrical structure) to the TO-type package.

Figure 7:
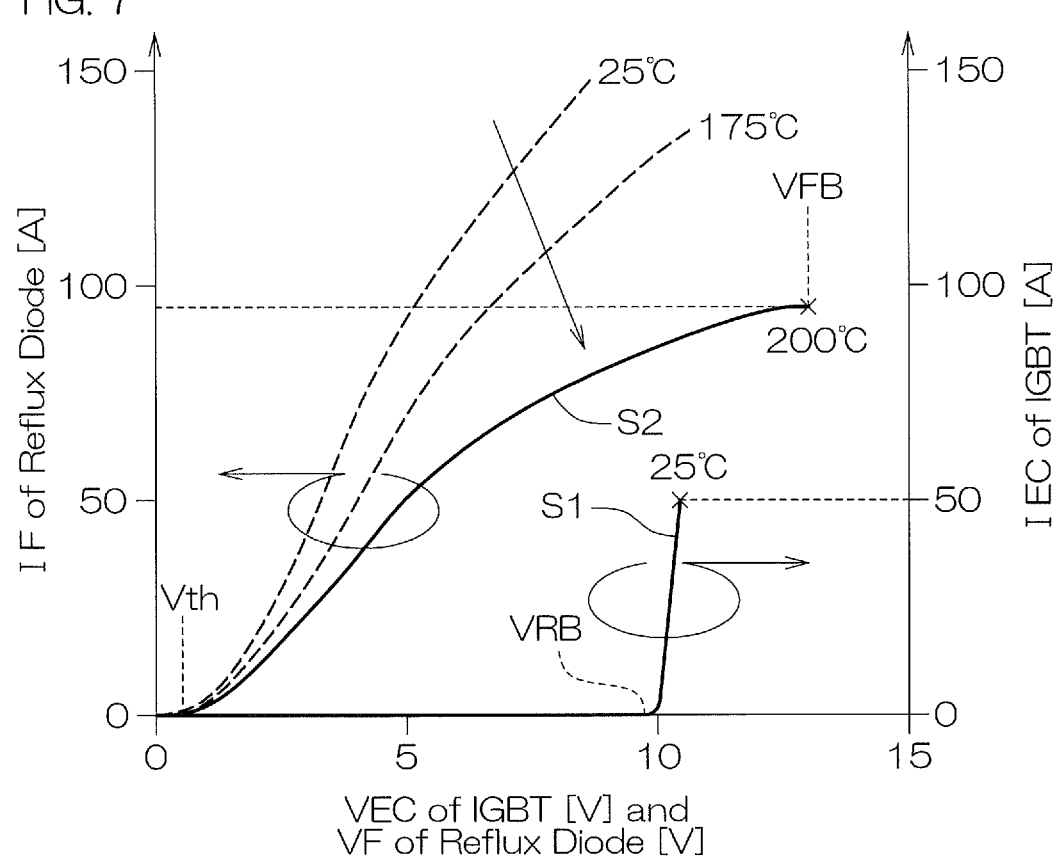
FIG. 7 is a graph which shows current-voltage characteristics of the first device and the second device shown in FIG. 3.

FIG. 7 is a graph which shows current-voltage characteristics of the first device 21 and the second device 31 in FIG. 3. The right ordinate indicates a reverse current IEC [A] between the emitter and the collector of the IGBT. The left ordinate indicates a forward current IF [A] of the reflux diode. The abscissa indicates a reverse voltage VEC [V] between the emitter and the collector of the IGBT and a forward voltage VF [V] of the reflux diode.

FIG. 7 shows first characteristics S1 and second characteristics S2. The first characteristics S1 show reverse current-voltage characteristics of the IGBT (first device 21) in a state of being electrically separated from the reflux diode (second device 31). Specifically, the first characteristics S1 are characteristics when a reverse voltage VEC is applied between the emitter and the collector in a state that a gate voltage is 0 V (that is, in an off state of the IGBT). A device temperature of the first device 21 at the start of measuring the first characteristics S1 is 25° C.

The second characteristics S2 show forward current-voltage characteristics of the reflux diode (second device 31) in a state of being electrically separated from the IGBT (first device 21). Specifically, the second characteristics S2 are characteristics when a forward voltage VF is applied between the anode and the cathode. A device temperature of the second device 31 at the start of measuring the second characteristics S2 is 25° C. In FIG. 7, the second characteristics S2 at 25° C. (see broken line), the second characteristics S2 at 175° C. (see broken line) and the second characteristics S2 at 200° C. (see solid line) are shown. A direction in which the forward voltage VF is to be applied coincides with a direction in which the reverse voltage VEC is to be applied. A direction in which the forward current IF to be flowed coincides with a direction in which the reverse current IEC to be flowed.

With reference to the first characteristics S1, the IGBT has a reverse withstand voltage VRB. The IGBT does not operate in a range that the reverse voltage VEC is less than the reverse withstand voltage VRB. In the IGBT, when reverse voltage VEC becomes not less than the reverse withstand voltage VRB, the emitter and the collector are conducted and the reverse current IEC begins to flow. The reverse withstand voltage VRB is defined by a reverse voltage VEC when the emitter and the collector of the IGBT are conducted and the reverse current IEC begins to flow. Specifically, the reverse withstand voltage VRB is defined by a reverse voltage VEC when the reverse current IEC begins to flow at an ordinary temperature (25° C.)

When the reverse current IEC continues to increase after the emitter and the collector have been conducted, the IGBT is broken. The IGBT is preferably designed such that the reverse current IEC flows to an extent that the IGBT is not broken. The reverse current IEC and the device temperature that cause breakage of the IGBT depend on a specification of the IGBT used.

As an example, the IGBT may have the reverse withstand voltage VRB of not less than 2 V and not more than 15 V. In this case, the IGBT preferably has the reverse withstand voltage VRB which is not less than 5 V and not more than 12 V. FIG. 7 shows an example in which the IGBT is broken at about 10 V of the reverse withstand voltage VRB of the IGBT and at about 50 A of the reverse current IEC. In this case, the IGBT is preferably operated in a range of less than 50 A.

With reference to the second characteristics S2, the reflux diode has a forward threshold voltage Vth which is less than the reverse withstand voltage VRB of the IGBT (0<Vth<VRB). In the reflux diode, when the forward voltage VF becomes not less than the forward threshold voltage Vth, the forward current IF begins to flow. The forward threshold voltage Vth of the reflux diode is a value in which the IGBT is not conducted between the emitter and the collector at the time of reflux operation of the reflux diode when the IGBT is switched from an on state to an off state.

As an example, the reflux diode may have the forward threshold voltage Vth which is not less than 0.5 V and not more than 2.5 V. A difference in voltage (VRB-Vth) between the reverse withstand voltage VRB of the IGBT and the forward threshold voltage Vth of the reflux diode is preferably not less than 1 V. The difference in voltage (VRB-Vth) is preferably not less than 2 V. The difference in voltage (VRB-Vth) is in particular preferably not less than 5 V. The difference in voltage (VRB-Vth) may have a lower limit of not less than 1 V, and an upper limit of the difference in voltage (VRB-Vth) is arbitrary. For example, in FIG. 7, the upper limit of the difference in voltage (VRB-Vth) may be not more than 10 V.

The reflux diode further has a forward breakdown voltage VFB which is in excess of the reverse withstand voltage VRB of the IGBT (Vth<VRB<VFB). The forward breakdown voltage VFB of the reflux diode is preferably not more than two times the reverse withstand voltage VRB of the IGBT (VRB<VFB≤2×VRB). The forward breakdown voltage VFB of the reflux diode is in particular preferably not more than 1.5 times the reverse withstand voltage VRB of the IGBT (VRB<VFB≤1.5×VRB).

In the reflux diode, the forward current IF increases with an increase in the forward voltage VF. The reflux diode is broken when the forward voltage VF exceeds the forward breakdown voltage VFB. The forward breakdown voltage VFB of the reflux diode is defined by a forward voltage VF when the reflux diode is broken.

Further, in the reflux diode, the device temperature rises with an increase in the forward voltage VF (forward current IF). The reflux diode has characteristics that a rate of an increase of the forward current IF in relation to a rate of an increase of the forward voltage VF decreases in association with a rise in device temperature. Therefore, specifically, the forward breakdown voltage VFB is defined by a forward voltage VF when the reflux diode is broken after a rise in temperature (200° C. in FIG. 7) from an ordinary temperature (25° C.)

In the semiconductor module 1, the reflux diode is anti-parallel connected to the IGBT (refer also to FIG. 6). Therefore, in the semiconductor module 1, as apparent from FIG. 7, when a voltage between terminals of the reflux diode (that is, forward voltage VF) becomes not less than the reverse withstand voltage VRB of the IGBT (VRB≤VF), the reverse current IEC begins to flow in the IGBT.

When the forward voltage VF is not less than the reverse withstand voltage VRB, the device temperature of the reflux diode is in excess of the device temperature of the IGBT. Further, when the reflux diode and the IGBT are both in operation, the device temperature of the reflux diode is in excess of the device temperature of the IGBT. The forward breakdown voltage VFB and the device temperature at which the reflux diode is broken are dependent on a specification of the reflux diode used.

As an example, the reflux diode may have a forward breakdown voltage VFB which is not less than 4 V and not more than 30 V. Where the reverse withstand voltage VRB of the IGBT is not less than 5 V and not more than 12 V, the reflux diode preferably has a forward breakdown voltage VFB which is not less than 10 V and not more than 24 V. In this case, it is in particular preferable that the reflux diode has a forward breakdown voltage VFB which is not less than 7.5 V and not more than 18 V. FIG. 7 shows an example in which the reflux diode is broken at about 13 V of the forward breakdown voltage VFB of the reflux diode and at about 90 A of the forward current IF.

Figure 8:
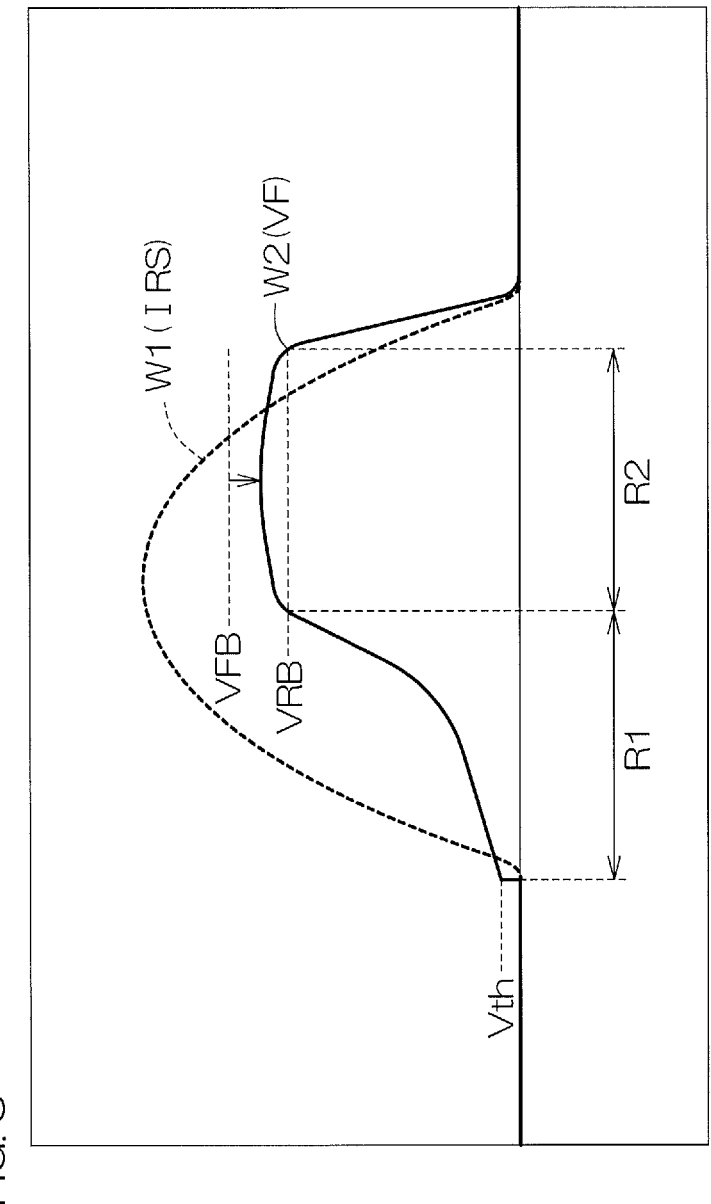
FIG. 8 is a waveform chart which describes an operation of the semiconductor module shown in FIG. 1.

FIG. 8 is a waveform chart which describes an operation of the semiconductor module 1 shown in FIG. 1. FIG. 8 shows a current waveform W1 and a voltage waveform W2. The current waveform W1 shows a pulse waveform of a reverse surge current IRS. The voltage waveform W2 shows a voltage waveform which is generated at the semiconductor module 1 in response to the reverse surge current IRS. Here, the reverse surge current IRS is applied between the emitter terminal electrode 25 and the collector terminal electrode of the semiconductor module 1 such that the forward voltage VF of the reflux diode exceeds the reverse withstand voltage VRB of the IGBT.

With reference to the current waveform W1 and the voltage waveform W2, the semiconductor module 1 has a first operating region R1 and a second operating region R2 which operate differently in response to the reverse surge current IRS at the time of application of the reverse surge current IRS.

The first operating region R1 is a region where the forward voltage VF increases gradually from 0 V. Specifically, the first operating region R1 is a region where the forward voltage VF is not less than the forward threshold voltage Vth and less than the reverse withstand voltage VRB of the IGBT. The second operating region R2 is a region which transitions from the first operating region R1 and in which the forward voltage VF is clamped. Specifically, the second operating region R2 is a region where the forward voltage VF is not less than the reverse withstand voltage VRB of the IGBT.

Figure 9A:
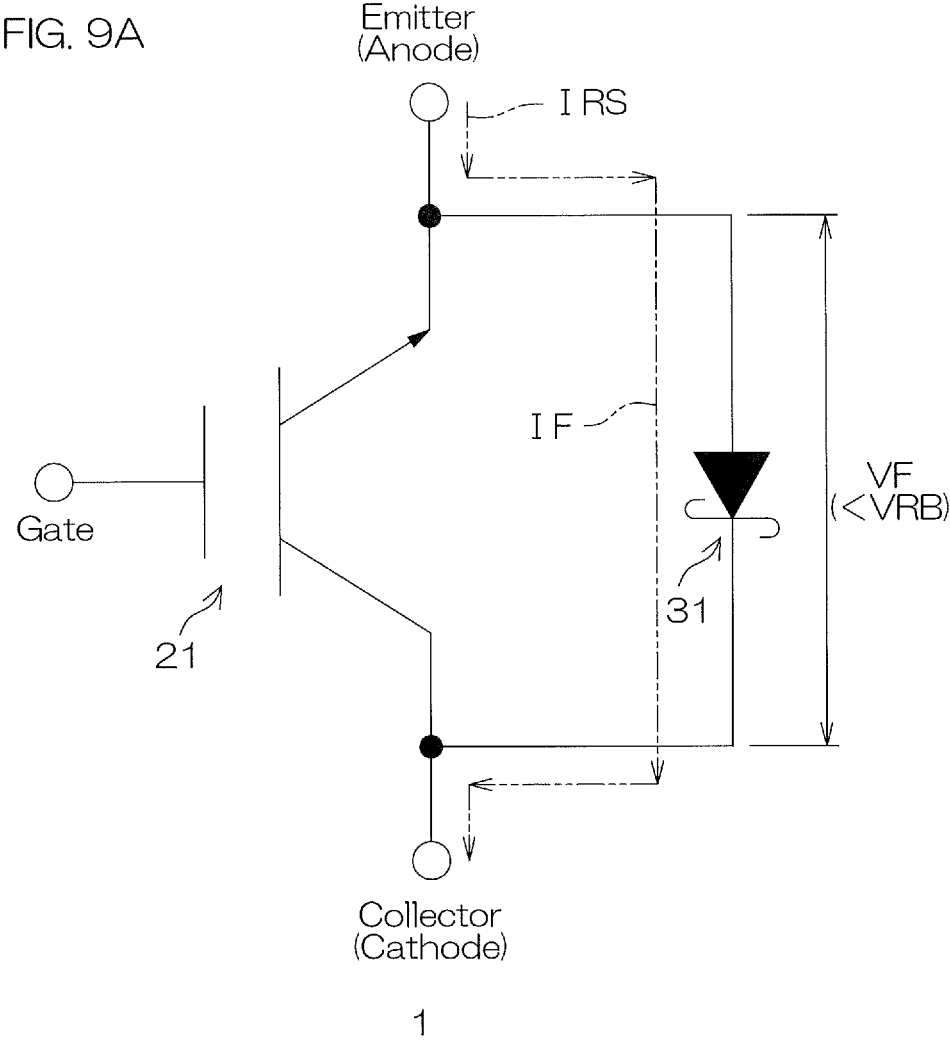
FIG. 9A is a circuit diagram which describes an operation of the semiconductor module in a first operating region shown in FIG. 8.
Figure 9B:
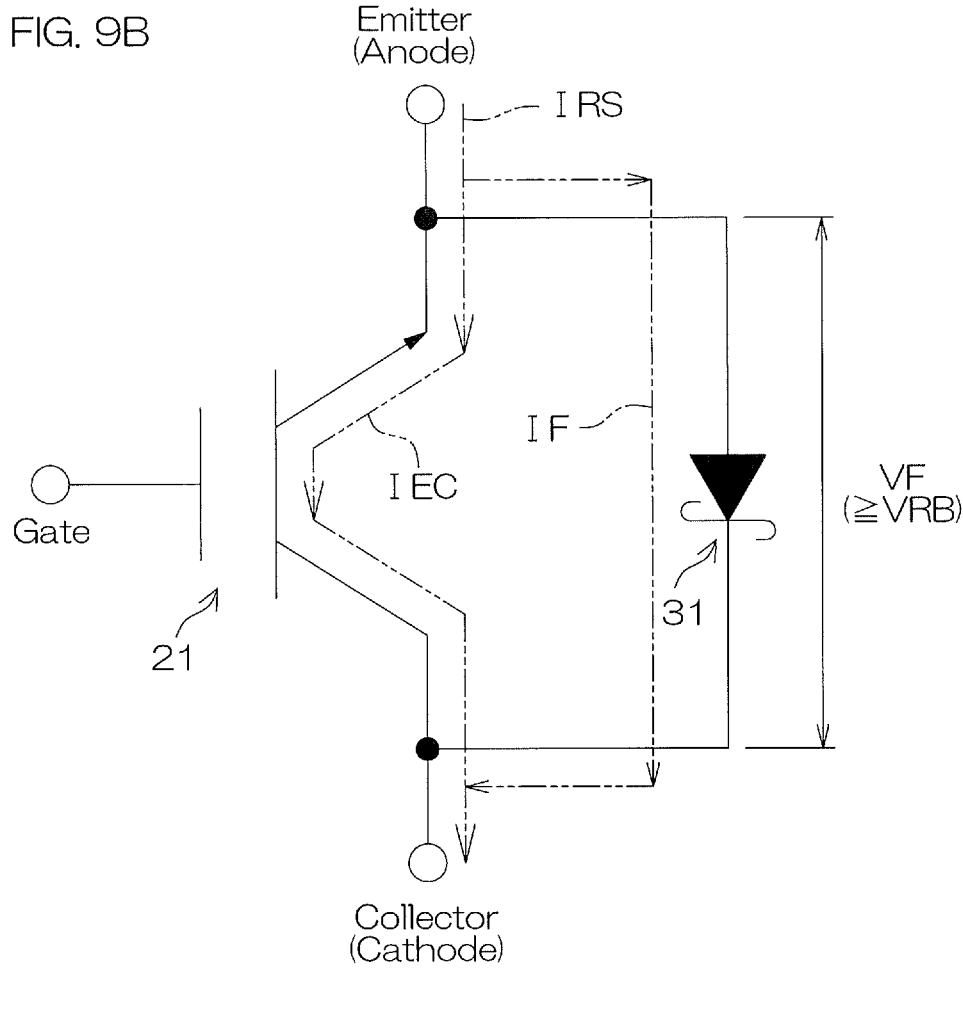
FIG. 9B is a circuit diagram which describes an operation of the semiconductor module in a second operating region shown in FIG. 8.

FIG. 9A is a circuit diagram which describes an operation of the semiconductor module 1 in the first operating region R1 shown in FIG. 8. FIG. 9B is a circuit diagram which describes an operation of the semiconductor module 1 in the second operating region R2 shown in FIG. 8.

With reference to FIG. 9A, in the first operating region R1 which is a region where the forward voltage VF is not less than the forward threshold voltage Vth and less than the reverse withstand voltage VRB (Vth≤VF<VRB), the reflux diode is operated, but on the other hand, the IGBT is not operated. That is, in the first operating region R1, the reverse surge current IRS flows into the reflux diode as a forward current IF. In the reflux diode, the forward voltage VF is increased with an increase in reverse surge current IRS (forward current IF). When the forward voltage VF becomes not less than the reverse withstand voltage VRB of the IGBT, the emitter and the collector of the IGBT are conducted, and a part of the reverse surge current IRS begins to flow in the IGBT.

With reference to FIG. 9B, the second operating region R2 is a region in which the forward voltage VF is not less than the reverse withstand voltage VRB and less than the forward breakdown voltage VFB (VRB≤VF<VFB) and, therefore, the reflux diode and the IGBT are both operated. That is, in the second operating region R2, a part of the reverse surge current IRS flows into the reflux diode as a forward current IF and also a remaining part of the reverse surge current IRS flows into the IGBT as a reverse current IEC. The reverse current IEC is a value of a range in which the IGBT is not broken.

That is, in the second operating region R2, since the reverse surge current IRS is branched and flows into the IGBT and the reflux diode, the reverse surge current IRS is processed by both of the IGBT and the reflux diode. Further, in the second operating region R2, the forward voltage VF of the reflux diode is clamped to the reverse voltage VEC of the IGBT and, therefore, the forward voltage VF is prevented from being increased. Thereby, it is possible to enhance the processing capability of the reverse surge current IRS, while the reflux diode is prevented from being broken.

For example, during a period of time when the forward voltage VF is clamped to the reverse voltage VEC (that is, second operating region R2), the reverse current IEC which flows in the IGBT may be not more than the forward current IF which flows in the reflux diode. A ratio IEC/IF of the reverse current IEC with respect to the forward current IF may be not less than 0.1 and not more than 1. The reverse current IEC which flows in the IGBT is preferably less than the forward current IF which flows in the reflux diode. In this case, the ratio of IEC/IF is preferably not less than 0.1 and not more than 0.8.

When the reverse surge current IRS decreases to such an extent that the forward voltage VF of the reflux diode becomes less than the reverse withstand voltage VRB of the IGBT, the IGBT returns to an off state, and the reverse surge current IRS flows in the reflux diode as a forward current IF. The reverse surge current IRS is processed in this way.

Figure 10:
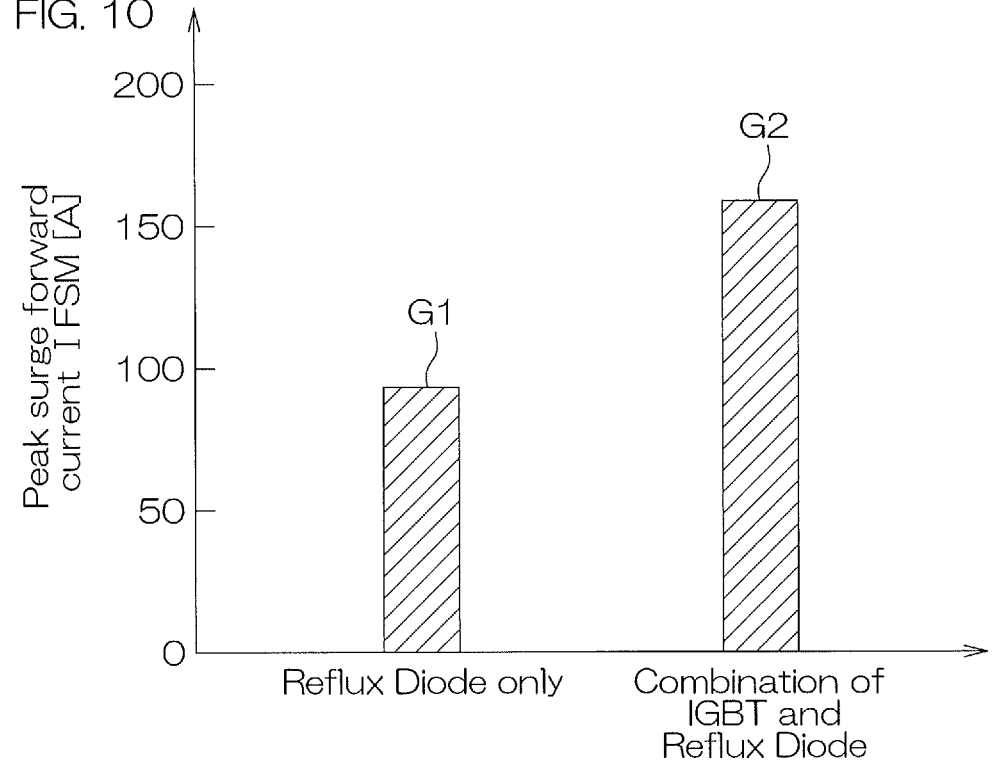
FIG. 10 is a graph which shows a peak surge forward current of the semiconductor module shown in FIG. 1.

FIG. 10 is a graph which shows a peak surge forward current IFSM of the semiconductor module 1 in FIG. 1. The ordinate indicates a peak surge forward current IFSM [A]. The abscissa indicates an item. FIG. 10 shows a first bar graph G1 and a second bar graph G2. The first bar graph G1 shows a peak surge forward current IFSM of only the reflux diode. The second bar graph G2 shows a peak surge forward current IFSM of the semiconductor module 1.

Specifically, the peak surge forward current IFSM of the semiconductor module 1 is a peak surge forward current IFSM of a combined structure of the IGBT and the reflux diode (anti-parallel circuit), indicating a reverse surge resistance of the semiconductor module 1. The peak surge forward current IFSM is, as publicly known, defined by a non-repetitive maximum allowable peak current value at which one cycle of sinusoidal half wave at a commercial frequency (50 Hz or 60 Hz) is allowed to flow in a forward direction.

With reference to the first bar graph G1, the peak surge forward current IFSM of the reflux diode is not less than 80 A and less than 100 A (about 90 A). In contrast thereto, with reference to the second bar graph G2, the peak surge forward current IFSM of the semiconductor module 1 is not less than 145 A and not more than 165 A (about 155 A) and increased about 1.7 times greater than the reflux diode. That is, in a range that the forward voltage VF is not less than the reverse withstand voltage VRB and less than the forward breakdown voltage VFB (VRB≤VF<VFB), a maximum sum of the forward current IF which flows in the reflux diode and the reverse current IEC which flows in the IGBT is in excess of the peak surge forward current IFSM of only the reflux diode.

As described above, the semiconductor module 1 includes the first device 21 which has the IGBT and the second device 31 which has the reflux diode. The reflux diode is anti-parallel connected to the IGBT. The reflux diode has the forward threshold voltage Vth less than the reverse with-stand voltage VRB of the IGBT and has the forward breakdown voltage VFB in excess of the reverse withstand voltage VRB of the IGBT (Vth<VRB<VFB).

According to the semiconductor module 1, when the IGBT is off, an increase in the forward current IF which flows in the reflux diode results in an increase in the forward voltage VF of the reflux diode due to an increase in the forward current IF. When the forward voltage VF is not less than the reverse withstand voltage VRB of the IGBT, the emitter and the collector of the IGBT are conducted, and reverse current IEC flows in the IGBT. Therefore, even upon application of the reverse surge current IRS, the reverse surge current IRS can be processed by both the IGBT and the reflux diode before the reflux diode is broken. Accordingly, it is possible to enhance a reverse surge resistance.

Where a ratio VFB/VRB of the forward breakdown voltage VFB with respect to the reverse withstand voltage VRB is not more than 1, the reflux diode is broken at the same time with conduction of the IGBT or before conduc-tion of the IGBT. In this case, the reverse surge resistance of the semiconductor module 1 is limited to the peak surge forward current IFSM of the reflux diode. Therefore, in the semiconductor module 1, the ratio of VFB/VRB is set at a value in excess of 1.

Under a condition that the ratio of VFB/VRB is in excess of 1, when the ratio of VFB/VRB is brought close to 1, the reverse surge current IRS can be processed by using the reflux diode up to a processing capability limit of the forward current IF (that is, the vicinity of the forward breakdown voltage VFB). On the other hand, when the ratio of VFB/VRB is moved away from 1, the emitter and the collector of the IGBT are conducted at a relatively low forward voltage VF. Thus, the IGBT is more likely to be broken in a state that the forward voltage VF of the reflux diode has a sufficient margin before reaching the forward breakdown voltage VFB.

Therefore, the ratio of VFB/VRB is preferably in excess of 1 and not more than 2. That is, the forward breakdown voltage VFB of the reflux diode is preferably not more than two times the reverse withstand voltage VRB of the IGBT (VRB<VFB≤2×VRB). The ratio of VFB/VRB may be not more than 1.2, not more than 1.4, not more than 1.6, not more than 1.8 or not more than 2. In this case, the ratio of VFB/VRB is in particular preferably not more than 1.5. That is, the forward breakdown voltage VFB of the reflux diode is in particular preferably not more than 1.5 times the reverse withstand voltage VRB of the IGBT (VRB<VFB≤1.5× VRB). The ratio of VFB/VRB is in particular preferably not less than 1.1.

In the above-described cases, the reverse surge current IRS can be processed by using the reflux diode up to the processing capability limit of the forward current IF (that is, the vicinity of the forward breakdown voltage VFB).

Thereby, it is possible to appropriately enhance the reverse surge resistance of the semiconductor module 1.

As an example, the reverse withstand voltage VRB of the IGBT may be not less than 2 V and not more than 15 V. In this case, the reverse withstand voltage VRB is preferably not less than 5 V and not more than 12 V. On the other hand, the forward breakdown voltage VFB of the reflux diode may be not less than 4 V and not more than 30 V. Where the reverse withstand voltage VRB of the IGBT is not less than 5 V and not more than 12 V, the forward breakdown voltage VFB of the reflux diode is preferably not less than 10 V and not more than 24 V. In this case, the forward breakdown voltage VFB of the reflux diode is in particular preferably not less than 7.5 V and not more than 18 V.

The forward threshold voltage Vth of the reflux diode is preferably a value in which the IGBT is not conducted between the emitter and the collector upon reflux operation of the reflux diode when the IGBT is switched from an on state to an off state. In other words, preferably selected is the IGBT that is not conducted between the emitter and the collector upon reflux operation of the reflux diode. In this case, while the IGBT and the reflux diode are appropriately operated in a forward direction, the reverse surge resistance can be enhanced. A lower limit of a difference (VRB-Vth) in voltage between the reverse withstand voltage VRB and the forward threshold voltage Vth may be not less than 1 V and an upper limit of the difference in voltage (VRB-Vth) is arbitrary.

Figure 11:
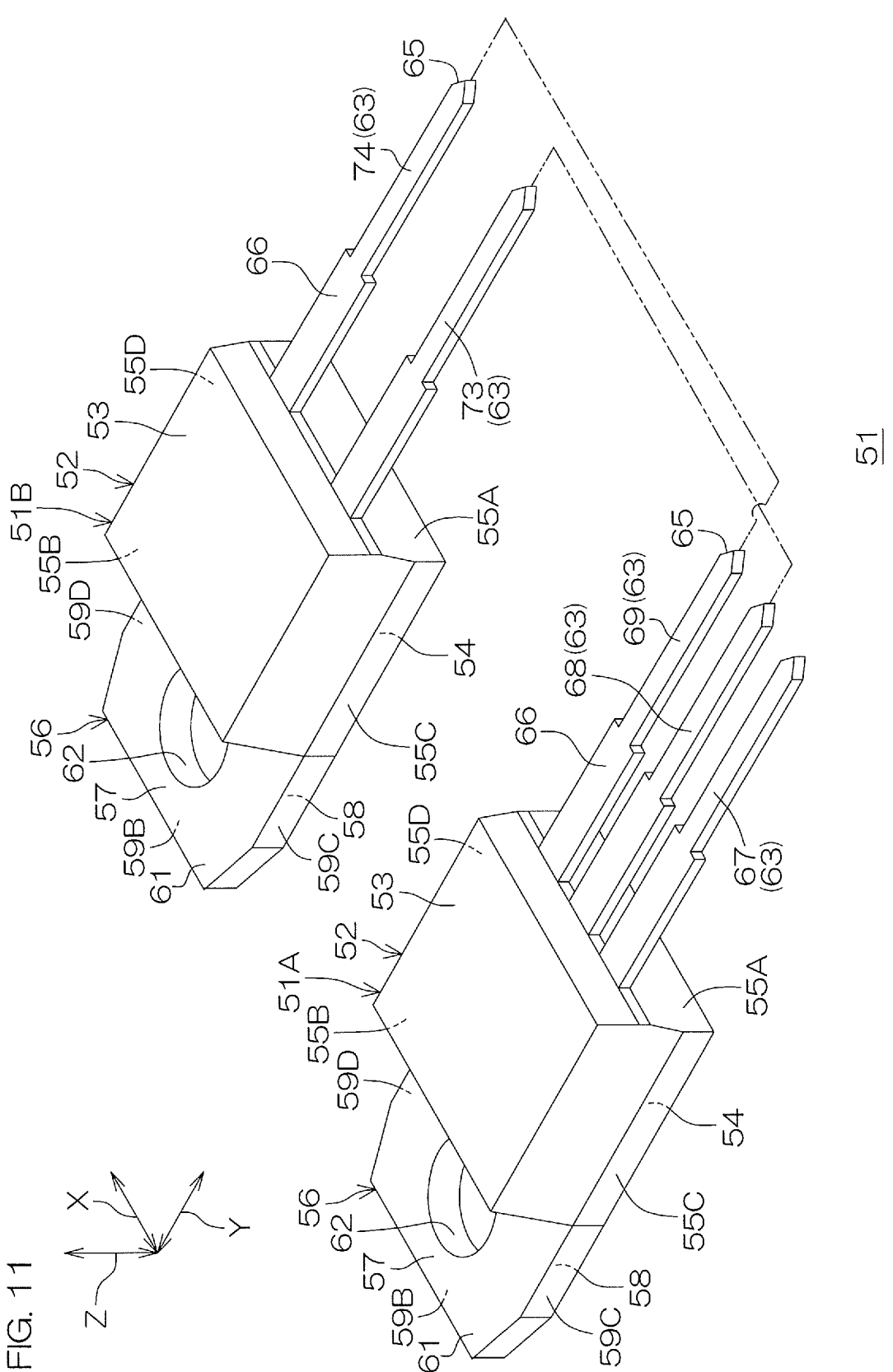
FIG. 11 is a drawing which shows a semiconductor module according to a second embodiment of the present invention.
Figure 12:
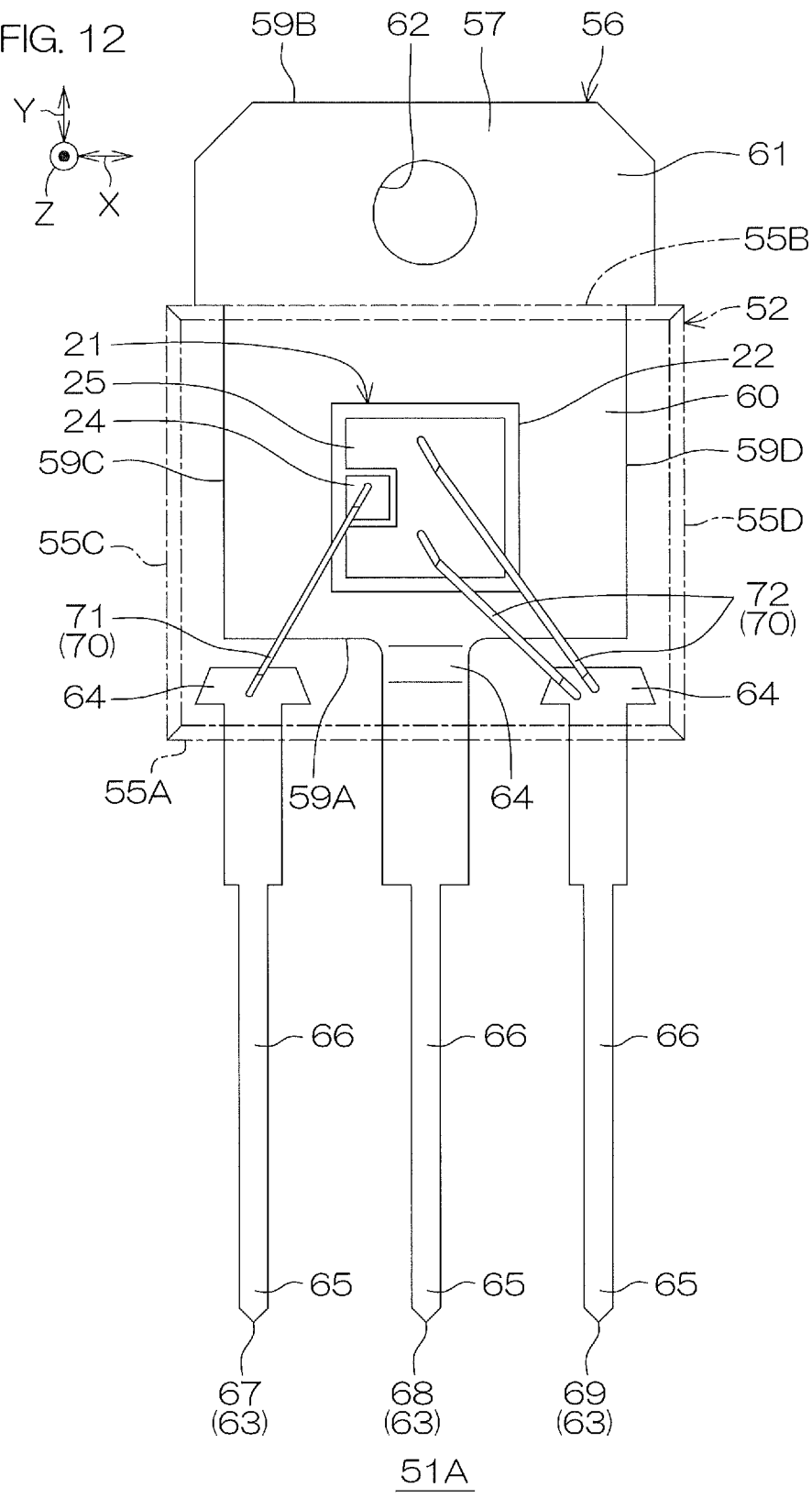
FIG. 12 is a plan view which shows an inner structure of a first module in FIG. 11.
Figure 13:
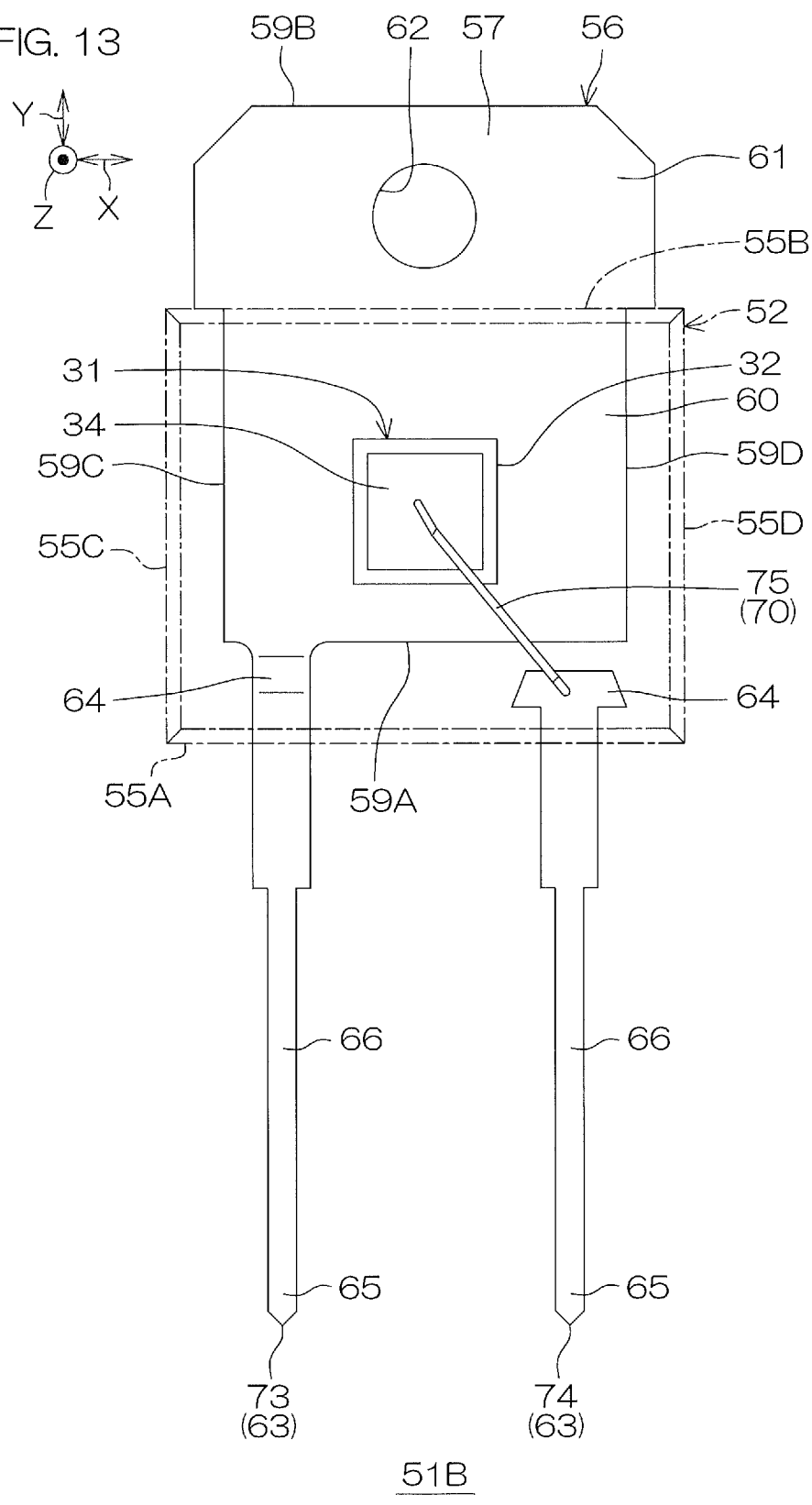
FIG. 13 is a plan view which shows an inner structure of a second module in FIG. 11.

FIG. 11 is a drawing which shows a semiconductor module 51 according to a second embodiment of the present invention. FIG. 12 is a plan view which shows an inner structure of a first module 51A in FIG. 11. FIG. 13 is a plan view which shows an inner structure of a second module 51B in FIG. 11.

With reference to FIG. 11 to FIG. 13, in this embodiment, the semiconductor module 51 is constituted of a two-package type module including the first module 51A in which the IGBT is housed in one package and the second module 51B in which the reflux diode is housed in one package. In FIG. 11, an electrical connection mode of the first module 51A and the second module 51B is shown by a virtual line. The semiconductor module 51 is actually con-stituted of the first module 51A and the second module 51B which are electrically connected to each other via a wiring formed in a circuit substrate such as a PCB.

With reference to FIG. 11 and FIG. 12, in this embodi-ment, the first module 51A is constituted of a TO-type package with three terminals (specifically, a TO-220 pack-age). The first module 51A includes a package main body (first package main body). The package main body 52 is made of a mold resin (for example, epoxy resin) and formed in a rectangular parallelepiped shape. The package main body 52 has a first main surface 53 at one side, a second main surface 54 at another side and first to fourth side walls 55A to 55D which connect the first main surface 53 and the second main surface 54.

The first main surface 53 and the second main surface 54 are each formed in a quadrilateral shape in plan view as viewed from a normal direction Z thereof. The first side wall 55A and the second side wall 55B extend along a first direction X and oppose a second direction Y which is orthogonal to the first direction X. The third side wall 55C and the fourth side wall 55D extend along the second direction Y and oppose the first direction X.

The first module 51A includes a metal plate 56 which is arranged inside the package main body 52. The metal plate 56 includes at least one of copper, a copper based alloy, iron and an iron based alloy. The metal plate 56 has a first plate surface 57 at one side, a second plate surface 58 at another side and first to fourth plate side walls 59A to 59D which connect the first plate surface 57 and the second plate surface 58.

The first plate surface 57 and the second plate surface 58 are formed in a quadrilateral shape (specifically, a rectangular shape) in plan view. The first plate surface 57 faces the first main surface 53 inside the package main body 52. The second plate surface 58 is exposed from the second main surface 54 of the package main body 52. The first to fourth plate side walls 59A to 59D extend respectively in parallel to the first to fourth side walls 55A to 55D.

Specifically, the metal plate 56 includes a first region 60 which is positioned inside the package main body 52 and a second region 61 which is positioned outside the package main body 52. The first region 60 is formed as a pad region, and the second region 61 is formed as a heat spreader. The second region 61 is led out from the first region 60 such as to cross the second side wall 55B of the package main body 52.

The second region 61 is formed in a tetragonal shape which is wider than the first region 60 with regard to the first direction X. The second region 61 may be formed such as to be equal in width to the first region 60 with regard to the first direction X. The second region 61 has a through hole 62 which passes through the second plate surface 58 from the first plate surface 57. The through hole 62 is formed in a circular shape in plan view. A planar shape of the through hole 62 is arbitrary and may be formed in a polygonal shape such as a quadrilateral shape. The first module 51A is screwed to an external heat sink or others by inserting a screw into the through hole 62.

The first module 51A includes a plurality (three in this embodiment) of lead terminals 63. The plurality of lead terminals 63 are arranged on the first side wall 55A side of the package main body 52 and led out from an interior of the package main body 52 to an exterior thereof. The plurality of lead terminals 63 each include at least one of copper, a copper based alloy, iron and an iron based alloy. On an outer surface of each of the plurality of lead terminals 63, a plating film made of a metal having a property high in affinity (that is, binding force) for solder may be formed. The plating film may include at least one of an Ni plating film, a Pd plating film and an Au plating film.

The plurality of lead terminals 63 are each formed in a band shape extending in a direction orthogonal to the first side wall 55A (that is, in the second direction Y). The plurality of lead terminals 63 each have a plate surface which is parallel to the first main surface 53 (second main surface 54) of the package main body 52. The plurality of lead terminals 63 each include an internal end portion 64, an external end portion 65 and a lead portion 66. The internal end portion 64 is positioned inside the package main body 52. The external end portion 65 is positioned outside the package main body 52. The lead portion 66 is led out from an interior of the package main body 52 to an exterior of the package main body 52 and extends in a band shape between the internal end portion 64 and the external end portion 65.

Specifically, the plurality of lead terminals 63 include a gate lead terminal 67, a collector lead terminal 68 and an emitter lead terminal 69. The gate lead terminal 67, the collector lead terminal 68 and the emitter lead terminal 69 are arrayed in that order from the third side wall 55C side toward the fourth side wall 55D side. The gate lead terminal 67 is a terminal to which a gate potential is to be applied. The collector lead terminal 68 is a terminal to which a collector potential is to be applied. The emitter lead terminal 69 is a terminal to which an emitter potential is to be applied.

The internal end portion 64 of the gate lead terminal 67 and the internal end portion 64 of the emitter lead terminal 69 are arranged at an interval from the metal plate 56. The internal end portion 64 of the collector lead terminal 68 is formed integrally with the metal plate 56 to fix the metal plate 56 at the same potential. Thereby, the metal plate 56 forms a part of the collector lead terminal 68.

A shape and an arrangement of the plurality of lead terminals 63 are arbitrary and not limited to an embodiment shown in FIG. 11 or FIG. 12. Further, an arrangement of the gate lead terminal 67, the collector lead terminal 68 and the emitter lead terminal 69 is arbitrary and not limited to an arrangement shown in FIG. 11 or FIG. 12. Further, the internal end portion 64 of the collector lead terminal 68 may be arranged at an interval from the metal plate 56.

The first module 51A includes the previously described first device 21. The first device 21 is arranged on the metal plate 56 (first plate surface 57 of first region 60) inside the package main body 52. Specifically, the first device 21 includes the first semiconductor chip 22, the first interlayer insulating film 23, the gate terminal electrode 24, the emitter terminal electrode 25 and the collector terminal electrode 26. The first device 21 is arranged on the metal plate 56 in such a posture that the gate terminal electrode 24 and the emitter terminal electrode 25 are opposed to the first main surface 53. The collector terminal electrode 26 of the first device 21 is mechanically and electrically connected to the metal plate 56 via a conductive bonding material (for example, solder).

The first module 51A includes a plurality (three in this embodiment) of lead wires 70, each of which electrically connects the first device 21 to a corresponding lead terminal 63 inside the package main body 52. The plurality of lead wires 70 are each constituted of a bonding wire. The plurality of lead wires 70 may include at least one of a copper wire, a gold wire and an aluminum wire. In this embodiment, the plurality of lead wires 70 are each constituted of an aluminum wire.

Specifically, the plurality of lead wires 70 include one or a plurality (one in this embodiment) of gate lead wires 71 and one or a plurality (two in this embodiment) of emitter lead wires 72. The number of the gate lead wires 71 and the emitter lead wires 72 is arbitrary and adjusted according to a planar area and a planar shape of each of the gate terminal electrode 24 and the emitter terminal electrode 25.

The gate lead wire 71 is connected to the internal end portion 64 of the gate lead terminal 67 and the gate terminal electrode 24 of the first device 21. The emitter lead wire 72 is connected to the internal end portion 64 of the emitter lead terminal 69 and the emitter terminal electrode 25 of the first device 21. Where the internal end portion 64 of the collector lead terminal 68 is arranged at an interval from the metal plate 56, the lead wire 70 includes a collector lead wire. In this case, the collector lead wire is connected to the metal plate 56, and the internal end portion 64 of the collector lead terminal 68.

With reference to FIG. 11 and FIG. 13, in this embodiment, the second module 51B is constituted of a TO-type package with two terminals (specifically, a TO-220 package). The second module 51B is different from the first module 51A in that it has the second device 31 in place of the first device 21. As with the first module 51A, the second module 51B includes the package main body 52 (second package main body), the metal plate 56, the plurality (two in this embodiment) of lead terminals 63 and the lead wire 70. Hereinafter, a description will be given of a structure different from the first module 51A, and other structures will be given the same reference signs, with a description thereof omitted.

The plurality of lead terminals 63 of the second module 51B include a cathode lead terminal 73 and an anode lead terminal 74. The cathode lead terminal 73 and the anode lead terminal 74 are arrayed in that order from the third side wall 55C side toward the fourth side wall 55D side. The cathode lead terminal 73 is a terminal to which a cathode potential is to be applied. The anode lead terminal 74 is a terminal to which an anode potential is to be applied.

The internal end portion 64 of the anode lead terminal 74 is arranged at an interval from the metal plate 56. The internal end portion 64 of the cathode lead terminal 73 is formed integrally with the metal plate 56 to fix the metal plate 56 at the same potential. Thereby, the metal plate 56 forms a part of the cathode lead terminal 73.

A shape and an arrangement of the plurality of lead terminals 63 are arbitrary and not limited to an embodiment shown in FIG. 11 or FIG. 13. An arrangement of the cathode lead terminal 73 and the anode lead terminal 74 is also arbitrary and not limited to an arrangement shown in FIG. 11 or FIG. 13. Further, the internal end portion 64 of the cathode lead terminal 73 may be arranged at an interval from the metal plate 56.

The second module 51B includes the previously described second device 31. The second device 31 is arranged on the metal plate 56 (first plate surface 57 of first region 60) inside the package main body 52. Specifically, the second device 31 includes the second semiconductor chip 32, the second interlayer insulating film 33, the anode terminal electrode 34 and the cathode terminal electrode 35. The second device 31 is arranged on the metal plate 56 in such a posture that the anode terminal electrode 34 is opposed to the first main surface 53. The cathode terminal electrode 35 of the second device 31 is mechanically and electrically connected to the metal plate 56 via a conductive bonding material (for example, solder).

The lead wire 70 of the second module 51B includes an anode lead wire 75. The number of the anode lead wires 75 is arbitrary and adjusted according to a planar area and a planar shape of the anode terminal electrode 34. The anode lead wire 75 is connected to the internal end portion 64 of the anode lead terminal 74 and the anode terminal electrode 34 of the second device 31. Where the internal end portion 64 of the cathode lead terminal 73 is arranged at an interval from the metal plate 56, the lead wire 70 includes a cathode lead wire. In this case, the cathode lead wire is connected to the metal plate 56, and the internal end portion 64 of the cathode lead terminal 73.

With reference to FIG. 11, the cathode lead terminal 73 of the second module 51B is electrically connected to the collector lead terminal 68 of the first module 51A. Further, the anode lead terminal 74 of the second module 51B is electrically connected to the emitter lead terminal 69 of the first module 51A. In the semiconductor module 51, the same anti-parallel circuit (refer to FIG. 6) as the semiconductor module 1 according to the first embodiment is constituted by the above-described connecting mode.

The first module 51A is not limited to the TO-type package but may be constituted of SOP, QFN, DFP, DIP, QFP, SIP, SOJ or various packages similar to them. These packages are different in shape of the package main body 52 as well as in arrangement and shape of the lead terminals 63 from the TO-type package but similar in basic structure (including the electrical structure) to the TO-type package.

The second module 51B is not necessarily constituted of the same package as the first module 51A but may be constituted of a package different from the first module 51A. The second module 51B is not limited to the TO-type package but may be constituted of SOP, QFN, DFP, DIP, QFP, SIP, SOJ or various packages similar to them. These packages are different in shape of the package main body 52 as well as in arrangement and shape of the lead terminals 63 from the TO-type package but similar in basic structure (including the electrical structure) to the TO-type package.

As described above, the semiconductor module 51 can also provide the same effects as those described in the semiconductor module 1.

The embodiments of the present invention may be implemented in other embodiments.

With each of the embodiments described above, a description has been given of an example in which the reverse withstand voltage VRB of the IGBT is not less than 2 V and not more than 15 V, the forward threshold voltage Vth of the reflux diode is not less than 0.5 V and not more than 2.5 V, the forward breakdown voltage VFB of the reflux diode is not less than 4 V and not more than 30 V. However, these are just examples and as long as the voltage conditions (Vth<VRB<VFB) are met, a specification of the IGBT and that of the reflux diode are arbitrary.

For example, the IGBT having the reverse withstand voltage VRB which is not less than 2 V and not more than 60 V (2 V<VRB<60 V) may be adopted. In this case, the reverse withstand voltage VRB may be not less than 35 V and not more than 60 V. The reflux diode having the forward threshold voltage Vth which is not less than 0.5 V and not more than 5 V (0.5 V<Vth<5 V) and the forward breakdown voltage VFB which is not less than 4 V and not more than 120 V (4 V<Vth<120 V) may be adopted. In this case, the forward breakdown voltage VFB may be in excess of 60 V and not more than 120 V. A difference in voltage (VRB-Vth) between the reverse withstand voltage VRB of the IGBT and the forward threshold voltage Vth of the reflux diode may be in excess of 10 V. The difference in voltage (VRB-Vth) may be in excess of 10 V and not more than 40 V (1 V≤VRB-Vth<40 V).

With each of the embodiments described above, the reflux diode constituted of SBD (SiC-SBD) has an advantage that can more easily realize voltage conditions (Vth<VRB<VFB) than the reflux diode which is constituted of a pn-junction diode, etc. However, the reflux diode is not necessarily constituted of SBD (SiC-SBD) as long as it meets the voltage conditions (Vth<VRB<VFB) and may be constituted of a diode other than SBD (for example, a pn-junction diode). In this case, the reflux diode may be constituted of FRD (Fast Recovery Diode) as an example of the pn-junction diode. Where the reflux diode is constituted of FRD, the second semiconductor chip 32 which is constituted of an Si substrate may be adopted.

With each of the embodiments described above, an arbitrary value is given to a stationary avalanche voltage of the IGBT and a stationary avalanche voltage of the reflux diode according to design ideas of the semiconductor module 1 or 51. The reflux diode may have the stationary avalanche voltage in excess of the stationary avalanche voltage of the IGBT. The forward resistance of the semiconductor module 1 or 51 is limited by the stationary avalanche voltage of the IGBT or the stationary avalanche voltage of the reflux diode. Therefore, where the stationary avalanche voltage of the reflux diode is made higher than the stationary avalanche voltage of the IGBT, it is possible to prevent a failure of the reflux diode (second device 31). The above-described structure can also provide the same effects as those described in the semiconductor module 1 or 51.

As a matter of course, the reflux diode may have the stationary avalanche voltage less than the stationary avalanche voltage of the IGBT. This structure is in particular effective in a case where the IGBT is constituted of Si-IGBT and the reflux diode is constituted of SiC-SBD. In this case, a pressure-resistant structure capable of enhancing the stationary avalanche voltage may be introduced into Si-IGBT that can be manufactured at a relatively low cost, and eliminates the necessity for introducing it into SiC-SBD at a relatively high cost. This structure can also provide the same effects as those described in the semiconductor module 1 or 51.

The semiconductor module 1 or 51 according to each of the embodiments described above may be incorporated into one of or both of a high potential-side arm circuit and a low potential-side arm circuit of an arm series circuit in an inverter circuit. The inverter circuit includes, for example, a half bridge circuit, an H bridge circuit and a three-phase inverter circuit. The half bridge circuit includes one arm series circuit. The H bridge circuit includes a parallel circuit in which two arm series circuits (A phase arm series circuit and B phase arm series circuit) are connected in parallel. The three-phase inverter circuit includes a parallel circuit in which three arm series circuits (U phase arm series circuit, V phase arm series circuit and W phase arm series circuit) are connected in parallel.

In the previously described first embodiment, a description has been given of an example of one package type module in which the IGBT (first device 21) and the reflux diode (second device 31) are housed in one package. However, a one package type semiconductor module in which one or a plurality of IGBTs and one or a plurality of reflux diodes are housed in one package may be adopted. In this case, a one package type semiconductor module which includes the half bridge circuit, the H bridge circuit or the three-phase inverter circuit may be adopted.

Figure 14:
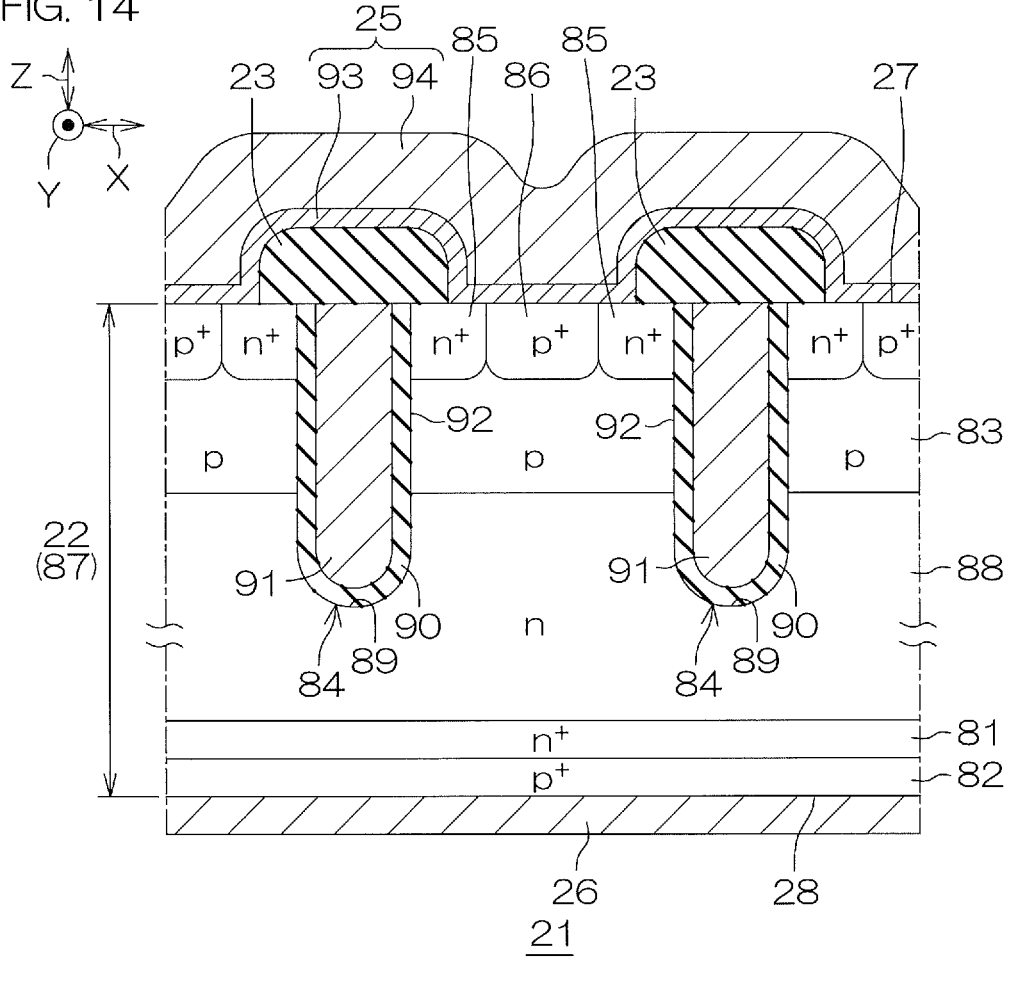
FIG. 14 is a sectional view which shows a first device according to a first example.

With each of the embodiments described above, a first device 21 having the characteristics shown in FIG. 14 may be adopted. FIG. 14 is a sectional view which shows the first device 21 according to the first example.

With reference to FIG. 14, the first device 21 includes the first semiconductor chip 22, an n-type buffer region 81, a p-type collector region 82, a p-type body region 83, a plurality of trench gate structures 84, a plurality of n-type emitter regions 85, a plurality of p-type contact regions 86, the first interlayer insulating film 23, the gate terminal electrode 24 (not shown), the emitter terminal electrode 25 and the collector terminal electrode 26.

The first semiconductor chip 22 is constituted of an n-type Si chip 87 (Si substrate). The Si chip 87 forms a drift region 88 of the IGBT. The buffer region 81 has an n-type impurity concentration in excess of an n-type impurity concentration of the drift region 88 (Si chip 87). The buffer region 81 is formed as a layer in a surface layer portion of the first non-device surface 28.

The collector region 82 is formed as a layer in a surface layer portion of the buffer region 81 on the first non-device surface 28 side. The collector region 82 forms a collector of the IGBT. The body region 83 is formed as a layer in a surface layer portion of the first device surface 27. The body region 83 has a p-type impurity concentration which is less than a p-type impurity concentration of the collector region 82.

The plurality of trench gate structures 84 are formed at an interval on the first device surface 27. Each of the plurality of trench gate structures 84 includes a trench 89, a gate insulating film 90 and a gate electrode 91. The trench 89 passes through the body region 83 to reach the drift region 88. The gate insulating film 90 covers an inner wall of the trench 89. The gate insulating film 90 may include silicon oxide. The gate electrode 91 is buried in the trench 89 across the gate insulating film 90. The gate electrode 91 forms a gate of the IGBT. The gate electrode 91 may include a conductive polysilicon.

The plurality of emitter regions 85 are each formed in a region between the plurality of trench gate structures 84 adjacent to each other in a surface layer portion of the body region 83. The plurality of emitter regions 85 form an emitter of the IGBT. The emitter region 85 has an n-type impurity concentration in excess of an n-type impurity concentration of the drift region 88 (Si chip 87).

The plurality of emitter regions 85 are each formed in a region along the plurality of trench gate structures 84 and each oppose a corresponding gate electrode across a corresponding gate insulating film 90. The plurality of emitter regions 85 define a channel region 92 of the IGBT with the drift region 88 inside the body region 83.

The plurality of contact regions 86 are each formed in a region between the plurality of trench gate structures 84 adjacent to each other in the surface layer portion of the body region 83. The contact region 86 has a p-type impurity concentration in excess of a p-type impurity concentration of the body region 83. In this embodiment, the plurality of contact regions 86 are each formed in a region between the plurality of emitter regions 85 adjacent to each other.

The first interlayer insulating film 23 collectively covers the plurality of trench gate structures on the first device surface 27. The gate terminal electrode 24 is formed on the first interlayer insulating film 23. The gate terminal electrode 24 passes through the first interlayer insulating film 23 and is electrically connected to the gate electrode 91. In this case, it is preferable that the gate electrode 91 includes a lead-out portion which is led out on the first device surface 27 and the gate terminal electrode 24 is connected to the lead-out portion of the gate electrode 91.

The emitter terminal electrode 25 is formed on the first interlayer insulating film 23 at an interval from the gate terminal electrode 24. The emitter terminal electrode 25 passes through the first interlayer insulating film 23 and is electrically connected to the emitter region 85 and the contact region 86.

Each of the gate terminal electrode 24 and the emitter terminal electrode 25 includes a barrier electrode 93 and a main electrode 94 which are stacked in that order from the first device surface 27 side. The barrier electrode 93 may have a single layered structure which includes a titanium film or a titanium nitride film. The barrier electrode 93 may have a stacked structure which includes a titanium film and a titanium nitride film in an arbitrary order. The main electrode 94 may include at least one of a pure Cu layer (Cu layer with purity of not less than 99%), a pure Al layer (Al layer with purity of not less than 99%), an AlSi alloy layer, an AlCu alloy layer and an AlSiCu alloy layer.

The collector terminal electrode 26 covers the first non-device surface 28 and is electrically connected to the collector region 82. The collector terminal electrode 26 forms an ohmic contact with the collector region 82. The collector terminal electrode 26 may include at least one of a Ti layer, an Ni layer, a Pd layer, an Au layer and an Ag layer.

Figure 15:
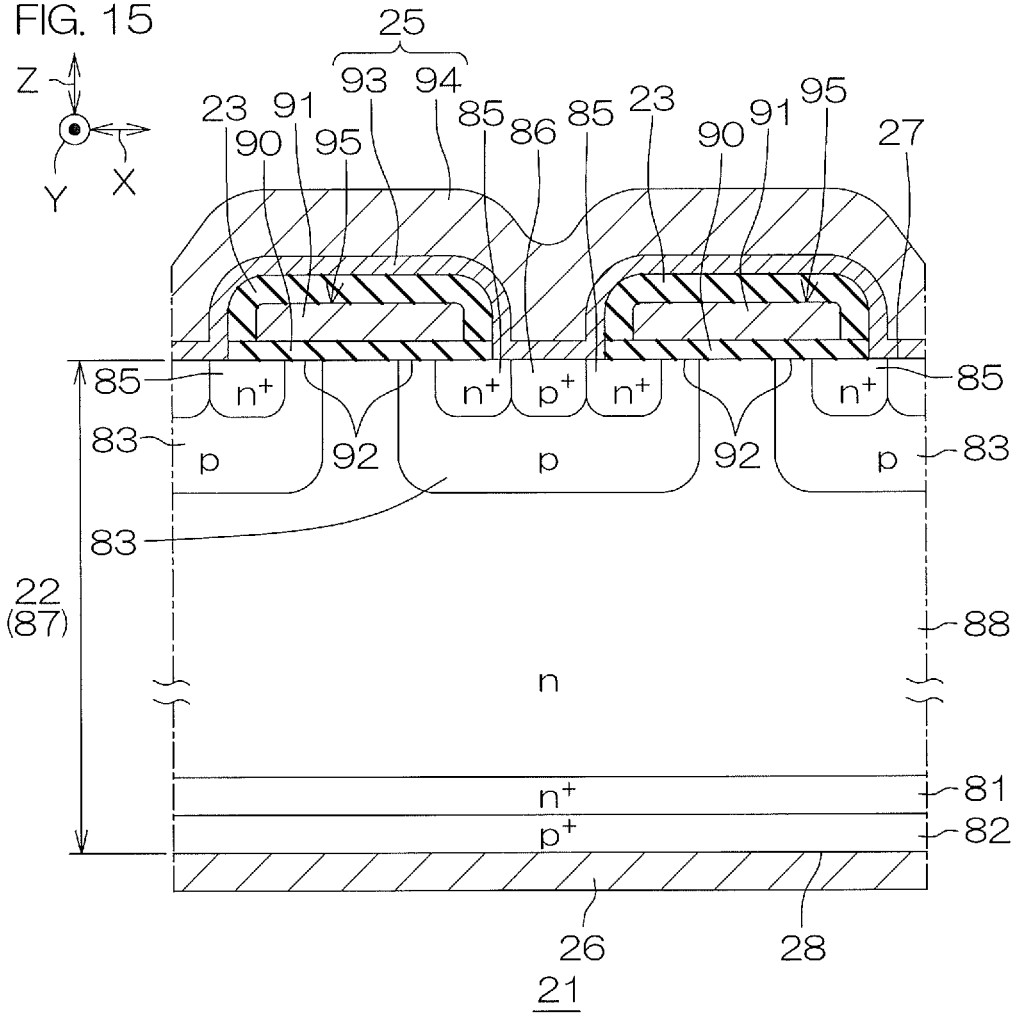
FIG. 15 is a sectional view which shows a first device of a second example.

With each of the embodiments described above, a first device 21 which has the characteristics shown in FIG. 15 may be adopted. FIG. 15 is a sectional view which shows the first device 21 according to the second example.

With reference to FIG. 15, the first device 21 includes the first semiconductor chip 22, the n-type buffer region 81, the p-type collector region 82, the plurality of p-type body regions 83, the plurality of n-type emitter regions 85, the plurality of p-type contact regions 86, a plurality of planar gate structures 95, the first interlayer insulating film 23, the gate terminal electrode 24 (not shown), the emitter terminal electrode 25, and the collector terminal electrode 26.

The first semiconductor chip 22 is constituted of an n-type Si chip 87 (Si substrate). The Si chip 87 forms the drift region 88 of the IGBT. The buffer region 81 has an n-type impurity concentration in excess of an n-type impurity concentration of the drift region 88 (Si chip 87). The buffer region 81 is formed as a layer in the surface layer portion of the first non-device surface 28.

The collector region 82 is formed as a layer in the surface layer portion of the buffer region 81 on the first non-device surface 28 side. The collector region 82 forms a collector of the IGBT. The plurality of body regions 83 are formed as a layer at an interval in the surface layer portion of the first device surface 27. The body region 83 has a p-type impurity concentration which is less than a p-type impurity concentration of the collector region 82.

The plurality of emitter regions 85 are formed in a surface layer portion of each of the body regions 83. The emitter region 85 forms an emitter of the IGBT. The emitter region 85 has an n-type impurity concentration in excess of an n-type impurity concentration of the drift region 88 (Si chip 87). Inside a corresponding body region 83, the plurality of emitter regions 85 are formed inwardly at an interval from an edge portion of the corresponding body region 83. The plurality of emitter regions 85 define the channel region 92 of the IGBT with the drift region 88 inside the body region 83.

The plurality of contact regions 86 are each formed in a region between the plurality of emitter regions 85 adjacent to each other in the surface layer portion of the body region 83. The contact region 86 has a p-type impurity concentration in excess of a p-type impurity concentration of the body region 83.

The plurality of planar gate structures 95 are formed at an interval on the first device surface 27. The plurality of planar gate structures 95 have a stacked structure which includes the gate insulating film 90 and the gate electrode 91 formed in that order from the first device surface 27. The gate insulating film 90 is formed over two adjacent body regions 83 to cover a corresponding channel region 92. The gate insulating film 90 may include silicon oxide.

The gate electrode 91 opposes the channel region 92 of the IGBT across the gate insulating film 90. The gate electrode 91 forms a gate of the IGBT. Specifically, the gate electrode 91 opposes the drift region 88, the body region 83 and the emitter region 85 across the gate insulating film 90. The gate electrode 91 may include a conductive polysilicon.

The first interlayer insulating film 23 covers collectively the plurality of planar gate structures 95 on the first device surface 27. The gate terminal electrode 24 is formed on the first interlayer insulating film 23. The gate terminal electrode 24 passes through the first interlayer insulating film 23 and is electrically connected to the gate electrode 91. The emitter terminal electrode 25 is formed on the first interlayer insulating film 23 at an interval from the gate terminal electrode 24. The emitter terminal electrode 25 passes through the first interlayer insulating film 23 and is electrically connected to the emitter region 85 and the contact region 86.

The gate terminal electrode 24 and the emitter terminal electrode 25 each include the barrier electrode 93 and the main electrode 94 stacked in that order from the first device surface 27 side. The barrier electrode 93 may have a single layered structure which includes a titanium film or a titanium nitride film. The barrier electrode 93 may have a stacked structure including a titanium film and a titanium nitride film in an arbitrary order. The main electrode 94 may include at least one of a pure Cu layer (Cu layer with purity of not less than 99%), a pure Al layer (Al layer with purity of not less than 99%), an AlSi alloy layer, an AlCu alloy layer and an AlSiCu alloy layer.

The collector terminal electrode 26 covers the first non-device surface 28 and is electrically connected to the collector region 82. The collector terminal electrode 26 forms an ohmic contact with the collector region 82. The collector terminal electrode 26 may include at least one of a Ti layer, an Ni layer, a Pd layer, an Au layer and an Ag layer.

Figure 16:
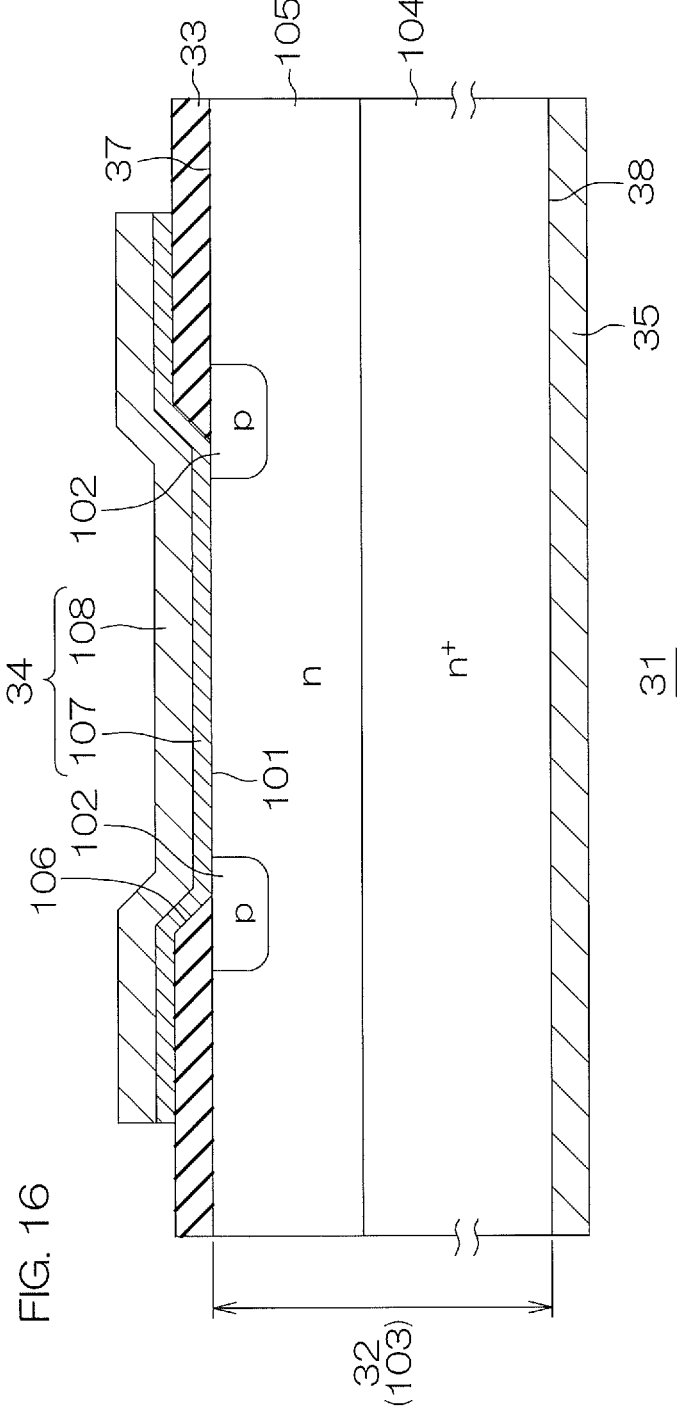
FIG. 16 is a sectional view which shows a second device according to one example.

With each of the embodiments described above, a second device 31 which has the characteristics shown in FIG. 16 may be adopted. FIG. 16 is a sectional view which shows the second device 31 according to one example.

With reference to FIG. 16, the second device 31 includes the second semiconductor chip 32, an n-type diode region 101, a p-type guard region 102, the second interlayer insulating film 33, the anode terminal electrode 34, and the cathode terminal electrode 35.

The second semiconductor chip 32 is constituted of an SiC chip 103 which is formed of hexagonal crystal SiC. The SiC chip 103 is constituted of 2H (Hexagonal)-SiC, 4H-SiC or 6H-SiC. The SiC chip 103 is preferably constituted of 4H-SiC. The second device surface 37 may face a silicon plane of SiC ((0001) plane), and the second non-device surface 38 may face a carbon plane of SiC ((000-1) plane).

The second device surface 37 and the second non-device surface 38 may have a predetermined off angle which is inclined in a predetermined off direction in relation to the c plane of SiC. The off direction is preferably an a-axis direction ([11-20] direction). The off angle may be not less than 0° and not more than 10°. The off angle is preferably in excess of 0° and not more than 4.5°.

Specifically, the SiC chip 103 (second semiconductor chip 32) has a stacked structure which includes an $n^+$-type SiC substrate 104 and an n-type SiC epitaxial layer 105. An n-type impurity concentration of the SiC epitaxial layer 105 is less than an n-type impurity concentration of the SiC substrate 104. A thickness of the SiC epitaxial layer 105 is less than a thickness of the SiC substrate 104. The thickness of the SiC substrate 104 may be not less than 40 μm and not more than 250 μm. The thickness of the SiC epitaxial layer 105 may be not less than 1 μm and not more than 50 μm.

The diode region 101 is formed in a surface layer portion of the second device surface 37. The diode region 101 is formed in a central portion of the second device surface 37. A planar shape of the diode region 101 is arbitrary. In this embodiment, the diode region 101 is formed by using a part of the SiC epitaxial layer 105.

An n-type impurity concentration of the diode region 101 is equal to an n-type impurity concentration of the SiC epitaxial layer 105. The n-type impurity concentration of the diode region 101 may exceed the n-type impurity concentration of the SiC epitaxial layer 105. In this case, the diode region 101 is formed by introduction of an n-type impurity into a surface layer portion of the SiC epitaxial layer 105.

The guard region 102 is formed in the surface layer portion of the second device surface 37 such as to demarcate the diode region 101. The guard region 102 is formed in a band shape extending along the diode region 101 in plan view. Specifically, the guard region 102 is formed in an annular shape (specifically, in an endless shape) which surrounds the diode region 101 in plan view. Thereby, the guard region 102 is formed as a guard ring region. A planar shape of the diode region 101 is adjusted by a planar shape of the guard region 102. The guard region 102 may be formed in a polygonal annular shape or a circular annular shape in plan view.

The second interlayer insulating film 33 is formed on the second device surface 37. The second interlayer insulating film 33 has a contact opening 106 which exposes the diode region 101. The contact opening 106 also exposes an inner peripheral edge of the guard region 102. A planar shape of the contact opening 106 is arbitrary.

The anode terminal electrode 34 enters into the contact opening 106 from above the second interlayer insulating film 33. The anode terminal electrode 34 is connected to the diode region 101 and the guard region 102 inside the contact opening 106. The anode terminal electrode 34 forms a Schottky junction with the diode region 101. Thereby, SiC-SBD which has the anode terminal electrode 34 as an anode and has the SiC chip 103 (second semiconductor chip 32) as a cathode is formed.

Specifically, the anode terminal electrode 34 has a stacked structure which includes a barrier electrode 107 and a main electrode 108 stacked in that order from the second device surface 37 side. The barrier electrode 107 forms a Schottky junction with the diode region 101. The barrier electrode 107 may include at least one of a Ti layer, a Pd layer, a Cr layer, a V layer, an Mo layer, a W layer, a Pt layer, and an Ni layer. The main electrode 108 may include at least one of a pure Cu layer (Cu layer with purity of not less than 99%), a pure Al layer (Al layer with purity of not less than 99%), an AlSi alloy layer, an AlCu alloy layer, and an AlSiCu alloy layer.

The cathode terminal electrode 35 covers the second non-device surface 38 and is electrically connected to the SiC substrate 104. The cathode terminal electrode 35 forms an ohmic contact with the SiC substrate 104. The cathode terminal electrode 35 may include at least one of a Ti layer, an Ni layer, a Pd layer, an Au layer, and an Ag layer.

Examples of features extracted from this description and the drawings are indicated below. The following [A1] to [A12] provide a semiconductor module which includes an IGBT and a reflux diode and is capable of enhancing a reverse surge resistance.

[A1] A semiconductor module including a first device that has an IGBT; and a second device that has a reflux diode which is anti-parallel connected to the IGBT, which has a forward threshold voltage less than a reverse withstand voltage of the IGBT, and which has a forward breakdown voltage in excess of the reverse withstand voltage of the IGBT.

[A2] The semiconductor module according to A1, wherein a reverse current is to be flowed in the IGBT before a forward voltage of the reflux diode reaches the forward breakdown voltage.

[A3] The semiconductor module according to A1 or A2, wherein the reverse current is to be flowed in the IGBT when the forward voltage of the reflux diode becomes not less than the reverse withstand voltage of the IGBT.

[A4] The semiconductor module according to any one of A1 to A3, wherein the reverse current to be flowed in the IGBT is not more than a forward current to be flowed in the reflux diode.

[A5] The semiconductor module according to any one of A1 to A4, wherein the forward breakdown voltage of the reflux diode is not more than two times the reverse withstand voltage of the IGBT.

[A6] The semiconductor module according to any one of A1 to A5, wherein a peak surge forward current of a combined structure of the IGBT and the reflux diode is in excess of a value of a peak surge forward current of only the reflux diode.

[A7] The semiconductor module according to any one of A1 to A6, wherein the reflux diode is constituted of a Schottky barrier diode.

[A8] The semiconductor module according to any one of A1 to A7, wherein the IGBT has a vertical structure, and the reflux diode has a vertical structure

[A9] The semiconductor module according to any one of A1 to A8 in which the IGBT is constituted of a trench gate type.

[A10] The semiconductor module according to any one of A1 to A9, wherein the first device has a first semiconductor chip in which the IGBT is formed, and the second device has a second semiconductor chip in which the reflux diode is formed and which includes a semiconductor different from that of the first device.

[A11] The semiconductor module according to A10, wherein the first semiconductor chip includes Si, and the second semiconductor chip includes a wide band gap semiconductor.

[A12] The semiconductor module according to A10 or A11, wherein the second semiconductor chip includes SiC or GaN.

The present application corresponds to Japanese Patent Application No. 2019-235147 filed on Dec. 25, 2019, in the Japan Patent Office, and the entire disclosure of this application is incorporated herein by reference. While the embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1: Semiconductor module
2: Package main body
21: First device
23: First semiconductor chip
31: Second device
32: Second semiconductor chip
51: Semiconductor module
52: Package main body
IEC: Reverse current
IF: Forward current
IFSM: Peak surge forward current
VF: Forward voltage
VFB: Forward breakdown voltage
VRB: Reverse withstand voltage
Vth: Forward threshold voltage

The invention claimed is:
1. A semiconductor module comprising:
a first device that has an IGBT; and
a second device that has a reflux diode which is anti-parallel connected to the IGBT, which has a forward threshold voltage less than a reverse withstand voltage of the IGBT, and which has a forward breakdown voltage in excess of the reverse withstand voltage of the IGBT, wherein a reverse current is to be flowed in the IGBT when a forward voltage of the reflux diode becomes not less than the reverse withstand voltage of the IGBT, the reverse current is not more than a forward current to be flowed in the reflux diode, and a ratio of the forward breakdown voltage of the reflux diode with respect to the reverse withstand voltage of the IGBT is excess of 1 and not more than 2.

2. The semiconductor module according to claim 1, wherein the reverse current is to be flowed in the IGBT before the forward voltage of the reflux diode reaches the forward breakdown voltage.

3. The semiconductor module according to claim 1, wherein a peak surge forward current of a combined structure of the IGBT and the reflux diode is in excess of a value of a peak surge forward current of only the reflux diode.

4. The semiconductor module according to claim 1, wherein the reflux diode is constituted of a Schottky barrier diode.

5. The semiconductor module according to claim 1, wherein the IGBT has a vertical structure, and the reflux diode has a vertical structure.

6. The semiconductor module according to claim 1, wherein the IGBT is constituted of a trench gate type.

7. The semiconductor module according to claim 1, wherein the first device has a first semiconductor chip in which the IGBT is formed, and the second device has a second semiconductor chip in which the reflux diode is formed and which includes a semiconductor different from that of the first device.

8. The semiconductor module according to claim 7, wherein the first semiconductor chip includes Si, and the second semiconductor chip includes a wide band gap semiconductor.

9. The semiconductor module according to claim 7, wherein the second semiconductor chip includes SiC or GaN.

10. The semiconductor module according to claim 1, further comprising:

a package main body that is made of a mold resin; and a metal plate that is arranged inside the package main body;

wherein the first device is arranged on the metal plate inside the package main body, and the second device is arranged on the metal plate at an interval from the first device inside the package main body.

11. The semiconductor module according to claim 10, further comprising:

lead terminals that are arranged inside the package main body and exposed from the package main body; and lead wires that electrically connect both the first and second devices to a single lead terminal inside the package main body.

*    *    *    *    *